(12) United States Patent
Narushima et al.

(10) Patent No.: US 10,100,429 B2
(45) Date of Patent: Oct. 16, 2018

(54) METHOD FOR PRODUCING A SILICON SINGLE CRYSTAL DOPED WITH RED PHOSPHOROUS WITH REDUCED NUMBER OF STACKING FAULTS AND METHOD FOR PRODUCING A SILICON WAFER USING THE SAME

(71) Applicant: SUMCO CORPORATION, Tokyo (JP)

(72) Inventors: Yasuhito Narushima, Tokyo (JP); Masayuki Uto, Tokyo (JP); Toshimichi Kubota, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/324,856

(22) PCT Filed: Apr. 8, 2015

(86) PCT No.: PCT/JP2015/060967
§ 371 (c)(1),
(2) Date: Jan. 9, 2017

(87) PCT Pub. No.: WO2016/103748
PCT Pub. Date: Jun. 30, 2016

(65) Prior Publication Data
US 2017/0283980 A1  Oct. 5, 2017

(30) Foreign Application Priority Data
Dec. 24, 2014  (JP) .................. 2014-261123

(51) Int. Cl.
*C30B 15/04* (2006.01)
*C30B 29/06* (2006.01)
(Continued)

(52) U.S. Cl.
CPC .......... *C30B 15/04* (2013.01); *C23C 16/0209* (2013.01); *C23C 16/24* (2013.01);
(Continued)

(58) Field of Classification Search
CPC ......... C30B 15/00; C30B 15/02; C30B 15/04; C30B 15/20; C30B 15/22; C30B 25/00;
(Continued)

(56) References Cited

U.S. PATENT DOCUMENTS 5,972,106 A * 10/1999 Ohta .................. C30B 15/14
117/13
2003/0068502 A1 * 4/2003 Togashi .................. C30B 15/00
428/446

(Continued)

FOREIGN PATENT DOCUMENTS

JP    2011-009613 A    1/2011
JP    2011-219300 A    11/2011
(Continued)

OTHER PUBLICATIONS

International Search Report issued with respect to Application No. PCT/JP2015/060967, dated Jun. 23, 2015.
IPRP in PCT/JP2015/060967, dated Jun. 27, 2017.

*Primary Examiner* — Kenneth A Bratland, Jr.
(74) *Attorney, Agent, or Firm* — Greenblum & Bernstein, P.L.C.

(57) ABSTRACT

A method for producing a single crystal includes: bringing a seed crystal into contact with a dopant-added melt, in which a red phosphorus is added to a silicon melt, such that a resistivity of the single crystal is 0.9 mΩ·cm or less and subsequently pulling up the seed crystal, to form a straight body of the single crystal; and withdrawing the single crystal from the dopant-added melt in a state that a temperature of an upper end of the straight body is 590 degrees C. or more.

12 Claims, 22 Drawing Sheets

(51) Int. Cl.
*C30B 15/20* (2006.01)
*C23C 16/02* (2006.01)
*C23C 16/24* (2006.01)
*C30B 15/22* (2006.01)
*C30B 25/20* (2006.01)
*C30B 33/02* (2006.01)
*C30B 25/02* (2006.01)

(52) U.S. Cl.
CPC .......... *C30B 15/203* (2013.01); *C30B 15/206* (2013.01); *C30B 15/22* (2013.01); *C30B 25/20* (2013.01); *C30B 29/06* (2013.01); *C30B 33/02* (2013.01); *C30B 25/02* (2013.01)

(58) Field of Classification Search
CPC .......... C30B 25/02; C30B 25/18; C30B 25/20; C30B 29/00; C30B 29/02; C30B 29/06; C30B 33/00; C30B 33/02; C30B 15/203; C30B 15/206; C23C 16/0209; C23C 16/24

USPC ... 117/11, 13–15, 19, 21, 35, 84, 88, 94–96, 117/106, 928, 931–932
See application file for complete search history.

(56) References Cited

U.S. PATENT DOCUMENTS

| | | | | |
|---|---|---|---|---|
| 2004/0069214 | A1* | 4/2004 | Choi | C30B 15/04 117/213 |
| 2009/0286393 | A1* | 11/2009 | Mathew | H01L 31/1804 438/655 |
| 2009/0293803 | A1* | 12/2009 | Tsurumaru | C30B 15/22 117/35 |
| 2011/0140241 | A1 | 6/2011 | Kawazoe et al. | |
| 2016/0102418 | A1* | 4/2016 | Narushima | C30B 15/206 428/446 |

FOREIGN PATENT DOCUMENTS

| | | | |
|---|---|---|---|
| JP | 2011219300 | A * | 11/2011 |
| WO | 2010/021272 | A1 | 2/2010 |
| WO | 2014/175120 | A1 | 10/2014 |

* cited by examiner

FIG. 19

| STRAIGHT BODY LENGTH [B] (mm) | TAIL LENGTH (mm) | LENGTH OF NON-SF GENERATION AREA IN STRAIGHT BODY (mm) | SLIP DISLOCATION LENGTH IN STRAIGHT BODY (mm) | PRODUCT LENGTH [A] (mm) | YIELD [A]/[B] |
|---|---|---|---|---|---|
| 550 | 200 | 490 | 0 | 490 | 89% |
| | 180 | 510 | 0 | 510 | 93% |
| | 140 | 550 | 0 | 550 | 100% |
| | 100 | 550 | 30 | 520 | 95% |
| | 0 (WITHOUT TAIL) | 550 | 80 | 470 | 85% |
| 1000 | 200 | 360 | 0 | 360 | 36% |
| | 180 | 380 | 0 | 380 | 38% |
| | 140 | 420 | 0 | 420 | 42% |
| | 100 | 460 | 30 | 430 | 43% |
| | 0 (WITHOUT TAIL) | 560 | 80 | 480 | 48% |

FIG. 22
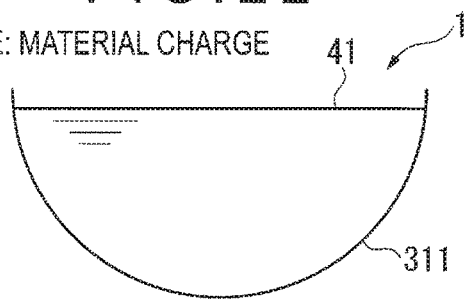
INITIAL STAGE: MATERIAL CHARGE
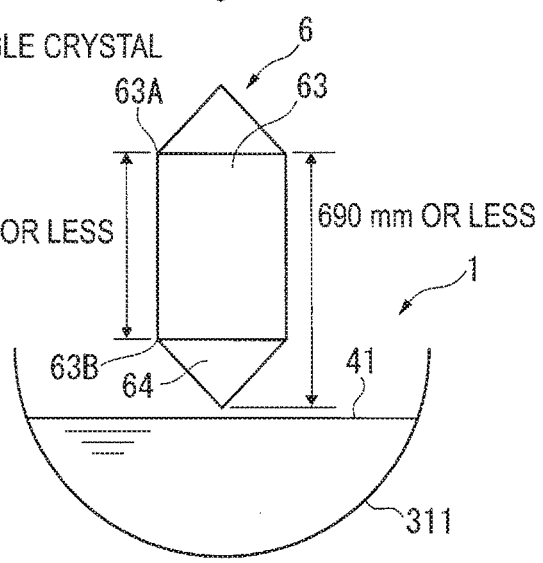
PULL UP SINGLE CRYSTAL
550 mm OR LESS
690 mm OR LESS
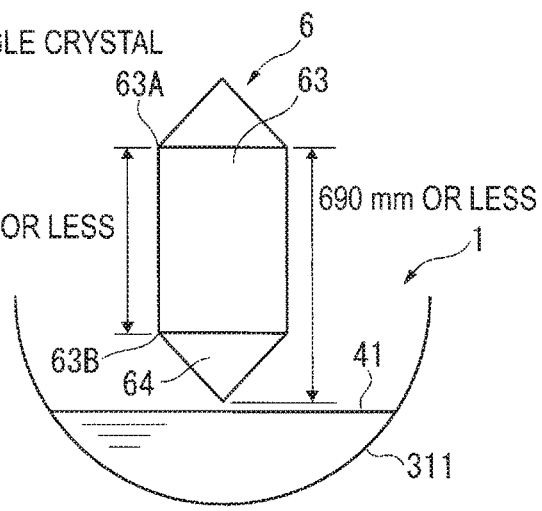
PULL UP SINGLE CRYSTAL
550 mm OR LESS
690 mm OR LESS

METHOD FOR PRODUCING A SILICON SINGLE CRYSTAL DOPED WITH RED PHOSPHOROUS WITH REDUCED NUMBER OF STACKING FAULTS AND METHOD FOR PRODUCING A SILICON WAFER USING THE SAME

TECHNICAL FIELD

The present invention relates to a producing method of a single crystal having low resistivity to which red phosphorus is added, a producing method of a silicon wafer, and a producing method of an epitaxial silicon wafer.

BACKGROUND ART

For instance, in an epitaxial silicon wafer to be used for a power MOS transistor, a silicon wafer of the epitaxial silicon wafer is required to have an extremely low substrate resistivity. In order to sufficiently decrease the substrate resistivity of the silicon wafer, there has been known a technique of doping arsenic (As) or antimony (Sb) as an n-type dopant for resistivity adjustment to molten silicon in a pulling step (i.e., at the time of growing a silicon crystal) of a single crystal ingot (hereinafter, referred to as a single crystal) as a material for a silicon wafer. However, since such a dopant is extremely volatile, it is difficult to sufficiently increase a dopant concentration in the silicon crystal, so that it is difficult to produce a silicon wafer having a resistivity as low as desired.

Accordingly, a silicon wafer having an extremely low substrate resistivity, which is doped with a highly concentrated phosphorus (P) as an n-type dopant having a volatility relatively lower than that of arsenic (As) or antimony (Sb), has been used.

On the other hand, since epitaxial growth occurs at a high temperature when producing an epitaxial silicon wafer, oxygen precipitates (BMD), oxygen precipitation nuclei or the like formed in the crystal during the growth of the single crystal are dissipated by the high temperature heat treatment, thereby lowering gettering ability.

In order to overcome the shortage in gettering ability, it is known to apply polysilicon back seal (PBS) before the epitaxial growing process. The polysilicon back seal is a kind of EG (External Gettering), in which a polysilicon film is formed on a backside of a silicon wafer to make use of strain fields or lattice mismatch created at an interface between the polysilicon film and the silicon wafer.

It was found that, however, when a polysilicon film is formed on a backside of a silicon wafer, a number of stacking faults (abbreviated as "SF" hereinafter) are generated on the epitaxial film, and the SF appearing on a top side of the silicon wafer in a form of steps significantly deteriorates LPD (Light Point Defect) level on the top side of the silicon wafer.

Accordingly, studies have been made in order to restrain the above disadvantage (see, for instance, Patent Literature 1).

Patent Literature 1 discloses that the generation of SF can be effectively restrained by forming a polysilicon film on a backside of a silicon wafer at a temperature of less than 600 degrees C.

CITATION LIST

Patent Literature(S)

Patent Literature 1 JP-A-2011-9613

SUMMARY OF THE INVENTION

Problem(s) to be Solved by the Invention

There is a recent need for an n-type silicon wafer of which substrate resistivity is 0.9 mΩ·cm or less. In order to meet such a need, an epitaxial silicon wafer produced by forming an epitaxial film on a silicon wafer, in which red phosphorus is densely doped in growing a single crystal, is required.

Accordingly, it is conceivable to apply the process disclosed in Patent Literature 1 in order to produce such an epitaxial silicon wafer.

However, when the substrate resistivity is extremely low as described above, generation of SF cannot be restrained even by applying the process disclosed in Patent Literature 1, so that a high-quality epitaxial silicon wafer cannot be produced.

An object of the invention is to provide a method for producing a single crystal capable of obtaining an epitaxial silicon wafer with a low resistivity on which generation of LPD caused by SF is restrained, a method for producing a silicon wafer, and a method for producing an epitaxial silicon wafer.

Means for Solving the Problem(s)

After vigorous studies, the inventors of the present invention have reached the following findings.

As described in Patent Literature 1, it is observed that, on a substrate formed with a polysilicon film, SF generated after an epitaxial growth is originated from minute pits (minute recesses) present on a surface of a silicon wafer before the epitaxial growth (after prebaking).

The minute pits are not observed on a silicon wafer that is doped with a highly concentrated boron (B) as a p-type dopant and subjected to a prebaking treatment. Thus, it is speculated that it is highly likely that the generation of minute pits is related to phosphorus densely doped in crystals of the silicon wafer.

It is speculated that the minute pits are generated according to the following mechanism. Specifically, oxygen and red phosphorus are present between lattices of the silicon wafer before the formation of a polysilicon film. When the concentration of red phosphorus in the silicon wafer is raised in order to lower the substrate resistivity, supersaturated red phosphorus is present between the lattices.

When the silicon wafer is heated in order to form the polysilicon film in this state, since a diffusing power of oxygen is greater than that of red phosphorus, oxygen moves through the lattices to be bonded with red phosphorus, whereby clusters (micro-precipitates) of oxygen and red phosphorus are formed.

When the silicon wafer before the epitaxial growth is prebaked in a hydrogen atmosphere, though the oxygen and red phosphorus in an outermost layer of the silicon wafer outwardly diffuse, the clusters remain in the outermost layer because they are in a stable state. Then, when the silicon wafer is subjected to hydrogen etching, due to a difference in an etching rate between the outermost layer of the silicon wafer and the clusters, the clusters are preferentially etched to provide the minute pits.

It is speculated that, when the silicon wafer provided with the minute pits is subjected to an epitaxial growth, the SF originated from the minute pits are generated.

Since it is speculated that the SF is generated due to the minute pits caused by the clusters of oxygen and red phosphorus as described above, it is speculated that the generation of the SF can be restrained by not applying the polysilicon back seal in which heating related to the formation of clusters is performed. Without a polysilicon film, gettering ability may be lowered. However, the gettering ability can be maintained by increasing the concentration of red phosphorus. Thus, the inventors speculated that the generation of the SF can be restrained without lowering the gettering ability even without a polysilicon film.

However, it was found after experiments made by the inventors that, when the concentration of red phosphorus is further increased in order to adjust the substrate resistivity at 0.9 mΩ·cm or less, the generation of the SF cannot be restrained only without applying the polysilicon back seal, which is a result that has not been expected so far. However, when SF distribution in a longitudinal direction of the crystal grown during the experiments was examined in detail in corresponding epitaxial wafers, it was found that the number of SF per one square centimeter in a silicon wafer of 200 mm diameter (hereinafter referred to simply as "SF number") was 10 or more in a part of the single crystal with a solidification rate of less than approximately 60%, and the SF number was 0 in another part with a solidification rate of more than the above level (i.e., approximately 60%) (an area encircled by dotted lines) as shown in FIG. 1. In other words, it was found that the SF number is dependent on the solidification rate of the single crystal.

It should be noted that the solidification rate refers to a ratio of pulled-up weight of the single crystal relative to an initial charge weight of a dopant-added melt initially stored in a quartz crucible. The SF number was measured by observing appearance of defects with Magics manufactured by Lasertec Corporation.

As a result of studies on the difference between the part with the solidification rate of less than approximately 60% and the part with the solidification rate of more than approximately 60% in view of the above results, the inventors noted that thermal history experienced by the crystal might have affected the SF number.

Accordingly, the inventors conducted experiments to examine a correlation between the solidification rate and the thermal history.

Experiment 1: Research on Correlation Between Solidification Rate/Thermal History and SF Number A producing process of a single crystal includes: forming a neck continuous with a seed crystal (neck-formation step); forming a shoulder continuous with the neck and having a gradually increasing diameter (shoulder-formation step); forming a straight body continuous with the shoulder and having a substantially constant diameter (straight-body-formation step); forming a tail continuous with a lower end of the straight body and having a gradually reducing diameter (tail-formation step); cooling the single crystal after the tail-formation step is completed (cooling step) are performed; and taking the single crystal out of a pull-up apparatus. Here, an upper end of the straight body is located at a border with the shoulder and denoted, for instance, by a reference numeral 63A in FIG. 21, and the lower end of the straight body is located at a border with the tail and denoted, for instance, by a reference numeral 63B in FIG. 21.

Since the single crystal experiences the above producing process, it is deduced that a cooling time elapsed after the single crystal is pulled out of the dopant-added melt becomes shorter toward a lower end of the single crystal (i.e., as the solidification rate increases).

Initially, a single crystal was produced according to the above producing process and a residence time at each of temperatures (500±50 degrees C., 700±50 degrees C., 900±50 degrees C. and 1100±50 degrees C.) for the solidification rates was measured. The results are shown in FIG. 2. It should be noted that red phosphorus (dopant) was added to the silicon melt to provide the dopant-added melt so that the substrate resistivity of silicon wafers became 0.9 mΩ·cm or less. In addition, a charge amount of the dopant-added melt was set at 100 kg.

As shown in FIG. 2, it was found that, the residence time at 500±50 degrees C. in particular is extremely shorter in the section with more than 60% of the solidification rate (an area encircled by chain double-dashed lines) than in the section with the solidification rate of less than 60%.

In addition, silicon wafers corresponding to the plurality of solidification rates were cut off from the single crystal to produce epitaxial silicon wafers, and the SF number of each of the epitaxial silicon wafers was examined. The results are shown in FIG. 2.

It should be noted that the epitaxial silicon wafer was produced by forming an epitaxial film after applying a prebaking treatment without providing a polysilicon film. Further, the prebaking treatment was performed by heating the silicon wafer before the formation of the epitaxial film for 30 seconds in a hydrogen atmosphere at 1200 degrees C.

As shown in FIG. 2, it was found that the SF number substantially correlates with the residence time of the single crystal at the temperature of 500±50 degrees C. and the SF number becomes zero at the section where the solidification rate is more than 60%.

From the above, it was found that the generation of SF can be restrained by reducing the time for a temperature of the single crystal to be 500±50 degrees C.

Experiment 2: Research on Generation Status of LPD Before and after Prebaking Treatment Initially, LPD on a silicon wafer and LPD on a silicon wafer after being subjected to a prebaking treatment were evaluated.

Specifically, a silicon wafer satisfying the following substrate conditions and being taken from a single crystal with a solidification rate causing the SF generation (i.e., corresponding to the solidification rate causing the SF), and another silicon wafer corresponding to the solidification rate not causing the SF were prepared.

Substrate Conditions
Diameter: 200 mm
Substrate Resistivity: 0.8 mΩ·cm
(Red Phosphorus Concentration: $9.47 \times 10^{19}$ atoms/cm$^3$)

Next, a backside oxidation film satisfying the following backside-oxidation-film formation conditions was formed on a backside (a face opposite a face on which an epitaxial film was formed) of each of the silicon wafers.

Backside-Oxidation-Film Formation Conditions
Film-Forming Method: CVD
Thickness of Backside Oxidation Film: 550 nm Then, the backside oxidation film at an outer periphery of the silicon wafer was removed from each of the silicon wafers provided with the backside oxidation film formed according to the above conditions to perform the LPD evaluation. Incidentally, the LPD was evaluated according to the following LPD evaluation conditions.

LPD Evaluation Conditions
Used Apparatus: Surface Inspection System (SP-1 manufactured by KLA-Tencor Corporation)
Observation Mode: DWN mode
Object to be Measured: LPD of 90 nm or larger FIG. 3 shows measurement results of the silicon wafer corresponding to the solidification rate causing SF generation. Though not illustrated herein, the measurement results of the silicon wafer corresponding to the solidification rate not causing the SF generation were substantially the same as those shown in FIG. 3.

Additionally, the silicon wafers on each of which the backside oxidation film was formed according to the above conditions were subjected to prebaking treatment satisfying the following prebaking conditions. The prebaking conditions simulate the conditions for the formation of the epitaxial film.

Prebaking Conditions
Atmosphere: hydrogen
Heat Treatment Temperature: 1200 degrees C.
Heat Treatment Time: 30 seconds Then, the LPD evaluation of each of the silicon wafers after being subjected to the prebaking treatment according to the above-described conditions was performed according to the above-described LPD evaluation conditions in Experiment 2. The results are shown in FIGS. 4 and 5.

As shown in FIG. 4, it was found that LPD 101 increases after the prebaking treatment in one of silicon wafers 100 corresponding to the solidification rate causing the SF generation. On the other hand, as shown in FIG. 5, it was found that the LPD 101 keeps substantially unchanged before and after the prebaking treatment in the silicon wafers 100 corresponding to the solidification rate not causing the SF generation.

When the silicon wafer shown in FIG. 4 in which the LPD was increased was observed with an AFM (Atomic Force Microprobe), it was found that the LPD is in a form of a pit P as shown in FIG. 6. In other words, it was found that the pit P generated after the prebaking treatment can be measured as the LPD of 90 nm or larger in the DCN mode of SP-1 manufactured by KLA-Tencor Corporation.

Experiment 3: Research on Generation Status of LPD Before and after Epitaxial Film Growth In the above Experiment 2, the silicon wafer corresponding to the solidification rate causing the SF generation as shown in FIG. 4 was applied with the prebaking treatment, and an epitaxial film satisfying the following epitaxial film growth conditions was formed on a surface of the silicon wafer to prepare an epitaxial silicon wafer.

Epitaxial Film Growth Conditions
Dopant Gas: Phosphine ($PH_3$) gas
Material Source Gas: Trichlorosilane ($SiHCl_3$) gas
Carrier Gas: Hydrogen gas
Growth Temperature: 1080 degrees C.
Thickness of Epitaxial Film: 3 μm
Resistivity (Epitaxial Film Resistivity): 1 Ω·cm
(Red Phosphorus Concentration: $4.86 \times 10^{15}$ atoms/cm$^3$)

Then, the LPD evaluation of the epitaxial silicon wafer prepared according to the above-described conditions was performed according to the LPD evaluation conditions in Experiment 2. In addition, the LPD evaluation results of the epitaxial silicon wafer were overlapped with the LPD evaluation results of the surface of the silicon wafer after being subjected to the prebaking treatment in the experiment shown in FIG. 4 (i.e., before the epitaxial film growth) for comparison. The results are shown in FIG. 7. In addition, distribution of LPD in an area encircled by chain double-dashed lines in FIG. 7 is shown in FIG. 8 in an enlarged manner.

As shown in FIG. 7, it was found that, though LPD are generated all over the surface of each the epitaxial wafers, many LPD are generated in an entire annular area A1 at a distance of approximately 2 to 6 cm from an outer edge of the epitaxial silicon wafer, in particular. Further, as shown in FIG. 8, it was found that points of LPD before and after the epitaxial film growth substantially coincide with each other.

In addition, in the LPD-generated points on the epitaxial silicon wafer, the points at which LPD had generated before the epitaxial film growth were evaluated according to the following LPD evaluation conditions.

LPD Evaluation Conditions
Used Apparatus: Surface Inspection System (Magics manufactured by Lasertec Corporation)

As a result, it was found that flat-type SF of a rectangular plan and triangular cross section (i.e., substantially quadrangular pyramid having a bottom face substantially flush with a surface of the epitaxial film and an apex recessed toward the silicon wafer) are generated at the evaluated points.

Experiment 4: Research on Temperature Condition Capable of Restraining Generation of SF After producing a single crystal under the same conditions as those in Experiment 1, without starting a cooling step, the pull-up of the single crystal was suspended for 10 hours while the tail was out of a dopant-added melt and the single crystal was kept being heated in the heated state during the tail-formation step. During the suspension, the temperature distribution at the center of the single crystal for each of the solidification rates was as shown in FIG. 9.

Subsequently, after the single crystal was taken out from a pull-up apparatus after elapsing 10 hours, epitaxial silicon wafers were produced under the same conditions as those in Experiment 1 (i.e., an epitaxial film was formed after applying a prebaking treatment in a hydrogen atmosphere at 1200 degrees C. for 30 seconds on a silicon wafer obtained from the single crystal). Then, the relationship between the number of LPD per each of epitaxial silicon wafers of 200 mm diameter (simply referred to as "LPD number" hereinafter) and the solidification rate was examined. The results are shown in FIG. 10.

Herein, the LPD number was measured with DCN mode of SP-1 manufactured by KLA-Tencor Corporation. The LPD to be measured was those with the size of 90 nm or more. Further, since there is a good correlation between the LPD number and the SF number, the LPD number was substituted by the SF number.

As shown in FIG. 10, it was found that the LPD number rapidly increases from a point at which the solidification rate is approximately 52%, is maximized approximately at 62% and is substantially 0 when the solidification rate exceeds 70%. It was also found that the temperature at the point at which the solidification rate is approximately 52% (i.e., the temperature at which the rapid increase in the LPD number starts) is approximately 470 degrees C.; the temperature at the point at which the solidification rate is approximately 62% (i.e., the temperature at which the LPD number is maximized) is approximately 570 degrees C.; and the temperature at the point at which the solidification rate is approximately 70% (i.e., the temperature at which the LPD number becomes substantially zero) is approximately 700 degrees C.

According to the above results, it was found that SF is likely to be generated when the temperature of the single crystal is kept for a long time approximately at 470 to 700 degrees C., especially approximately at 570 degrees C. for a long time.

Next, a tolerable range relative to a central temperature was determined.

Specifically, based on the experimental results in the above FIG. 10, a residence time at each of temperatures (550±30 degrees C., 570±30 degrees C. and 600±30 degrees C.) for each of corresponding solidification rates was examined. The results are shown in FIG. 11. Additionally, the residence time at each of temperatures 550±50 degrees C., 570±50 degrees C. and 600±50 degrees C. is shown in FIG. 12, and the residence time at each of temperatures 550±70 degrees C., 570±70 degrees C. and 600±70 degrees C. is shown in FIG. 13.

As shown in FIGS. 11 to 13, it was found that an increase width of the residence time at each of temperatures 550±70 degrees C., 570±70 degrees C. and 600±70 degrees C. (i.e., a horizontal length in the figure) and an increase width of the LPD number (i.e., the horizontal length in the figure) substantially coincide with each other.

Thus, it was found that LPD is likely to be generated when the temperature of the single crystal is kept for a long time at 570±70 degrees C.

Additionally, the inventors examined how long time was tolerable for the single crystal to be kept at the temperature of 570±70 degrees C. in order not to generate LPD.

Initially, after performing the tail-formation step under the same conditions as in Experiment 1, the single crystal was gradually cooled as shown in solid lines in FIG. 14 instead of being rapidly cooled in a usual cooling step as shown in chain double-dashed lines in FIG. 14. It should be noted that the ordinate axis in FIG. 14 represents a residence time at the temperature of 650±50 degrees C.

Then, with the use of the single crystal produced according to the conditions represented by the solid lines in FIG. 14, epitaxial silicon wafers were produced under the same conditions as those in Experiment 1 to examine the LPD number in each of the solidification rates. The relationship between the residence time in each of the solidification rates and the LPD number is shown in FIG. 15. It should be noted that the ordinate axis in FIG. 15 represents a residence time at the temperature of 570±70 degrees C.

As shown in FIG. 15, it was found that the LPD number becomes 0 when the solidification rate exceeds approximately 66%. It was also found that the residence time at the temperature of 570±70 degrees C. at this time is approximately 200 minutes.

Thus, it is speculated that the generation of LPD is likely to be restrained by reducing the time for the temperature of the single crystal to be 570±70 degrees C. to 200 minutes or less.

Next, an experiment for verifying the experimental results in FIG. 15 was conducted.

After performing the tail-formation step under the same conditions as those in Experiment 1, a cooling step as shown in a chain double-dashed line in FIG. 14 was performed to produce a single crystal. Then, with the use of the single crystal, epitaxial silicon wafers were produced under the same conditions as those in Experiment 1 to examine the LPD number in each of the solidification rates. The results are shown in FIG. 16.

As shown in FIG. 16, it was found that, when the solidification rate is over approximately 44%, the time for the single crystal to be at the temperature of 570±70 degrees C. ranges from 20 minutes to 200 minutes, and the LPD number is reduced.

Accordingly, it was found that the generation of LPD caused by the SF is likely to be restrained not only in a latter half of the single crystal but also in the entire area of the straight body as a product by setting the time for the single crystal to be at the temperature of 570±70 degrees C. in a range from 20 to 200 minutes.

Experiment 5: Study on Conditions for Producing Single Crystal Capable of Restraining Generation of LPD Caused by SF in Entire Area of Straight Body.

Under the same conditions as those in Experiment 1, single crystals having the respective straight bodies of 1,000 mm, 680 mm, 550 mm, and 500 mm in length were produced, and the residence time at each position on each of the straight bodies at the temperature of 570±70 degrees C. was examined. The results are shown in FIG. 17. Incidentally, the length of the tail of the single crystal was set to 140 mm. The diameter of the single crystal was set to 200 mm. The horizontal axis in FIG. 17 indicates positions on each of the straight bodies from its lower end as a standard (i.e., 0 mm).

As shown in FIG. 17, it was found that, when the straight body has a length of 500 mm or 550 mm, the residence time at the temperature of 570±70 degrees C. is in a range from 20 minutes to 200 minutes in the entire area of the straight body, and when the straight body has a length of 680 mm or 1,000 mm, the residence time at the temperature of 570±70 degrees C. exceeds 200 minutes in a part of the area of the straight body. From view of the above, it was found that, when the length of the straight body is set to 550 mm or less, the generation of the LPD caused by the SF is likely to be restrained in the entire area of the straight body.

<Experiment 6: Study on Temperature at Center of Single Crystal when Single Crystal is Withdrawn from Dopant-Added Melt Under the same conditions as those in Experiment 1, single crystals having the respective straight bodies of 1,000 mm and 550 mm in length were produced, and temperature distribution at the center of each of the single crystals when the single crystals were withdrawn from the dopant-added melt was examined. The results are shown in FIG. 18. Incidentally, the length of the tail of the single crystal was set to 140 mm. Further, the diameter of the single crystal was set to 200 mm. The horizontal axis in FIG. 18 indicates positions on each of the straight bodies from its upper end as a standard (i.e., 0 mm).

As shown in FIG. 18, it was found that, when the length of the straight body is 550 mm, the temperature at the upper end of the straight body at the time of withdrawing the single crystal is 590 degrees C. or more, and the temperature of the straight body is increased toward the lower end thereof. In contrast, it was found that when the length of the straight body is 1,000 mm, the temperature at the upper end of the straight body at the time of withdrawing the single crystal is 300 degrees C. or less, and thus the temperature of the straight body is increased toward the lower end thereof.

Based on the results of Experiments 5 and 6 described above, it was deduced that, when the temperature of the upper end of the straight body at the time of withdrawing the single crystal is set to 590 degrees C. or more, the residence time at the temperature of 570±70 degrees C. ranges from 20 minutes to 200 minutes in the entire area of the straight body, and thus it was found that the generation of the LPD caused by the SF is likely to be restrained in the entire area of the straight body.

<Experiment 7: Research on Relationship Between Length of Tail and Generation Status of SF>

Firstly, under the same conditions as those in Experiment 5, ten kinds of single crystals each having a straight body with a length of 550 mm or 1,000 mm and having a tail with a length of 200 mm, 180 mm, 140 mm, 100 mm, or 0 mm (i.e., without the tail) were produced. Next, a silicon wafer was cut off from a plurality of positions of each of the single crystals, and the generation status of the SF in the epitaxial silicon wafer was examined in the same manner as in Experiment 1.

FIG. 19 shows the respective lengths of the areas in which the SF is not generated in the straight bodies of the single crystals (i.e., non-SF generation areas).

As shown in FIG. 19, it was found that, in the single crystal having the straight body with the length of 550 mm, when the length of the tail is 180 mm or more, the SF is generated in an area at the upper end of the straight body, and when the length of the tail is 140 mm or less (including the single crystal without the tail), the SF is not generated in the entire area of the straight body. Incidentally, the reason why the SF generates when the length of the straight body is 550 mm and the length of the tail is 180 mm or more is deduced that the temperature in the area at the upper end of the straight body immediately after the formation of the tail is decreased to less than 590 degrees C., and the time during which the temperature of the area is at 570±70 degrees C. exceeds 200 minutes in the whole process of producing the single crystal.

It was also found that, when the length of the straight body of the crystal is 1,000 mm, regardless of the length of the tail, the SF was generated in a part of the straight body.

From view of the above, it is deduced that the generation of the LPD caused by the SF can be restrained in the entire area of the straight body, and the temperature at the upper end of the straight body at the time of withdrawing the single crystal is 590 degrees C. or more when the single crystal is withdrawn from the dopant-added melt, with the length of the straight body being 550 mm or less and the length of the tail being 140 mm or less, namely, in a state that a distance between the upper end of the straight body and the dopant-added melt is 690 mm or less.

<Experiment 8: Research on Relationship Between Length of Tail and Generation Status of Slip Dislocation>

When the single crystal is withdrawn from the dopant-added melt, dislocation may occur from the lower end of the single crystal as a starting point and may be transmitted as slip dislocation. When such slip dislocation occurs, though the generation of the LPD caused by the SF can be restrained, a portion having such slip dislocation is not usable as a product (i.e., the epitaxial silicon wafer).

Accordingly, the length of the slip dislocation of each single crystal produced under the conditions shown in FIG. 19 was examined.

FIG. 19 shows a length of the slip dislocation in the straight body of each single crystal, a length of the product (i.e., length of an area in which the slip dislocation does not occur in the non-SF generation area), and a yield (i.e., ratio of an area usable as the product relative to the straight body).

It was found that, as shown in FIG. 19, in the single crystal having the straight body with the length of 550 mm or 1,000 mm, when the length of the tail exceeds 140 mm, though the slip dislocation occurs at the tail, the slip dislocation is not transmitted to the straight body, so that the entire non-SF generation area is usable as the product. It was found that, in particular, when the length of the straight body is 550 mm and the length of the tail is 140 mm, the generation of the SF and slip dislocation do not occur in the straight body.

Incidentally, it is preferable that the entire area of the straight body can be used as the product (i.e., the yield is 100%). However, as long as the yield is 90% or more that is greater than the conventional one, the production efficiency is not significantly affected. Namely, when the length of the tail is 100 mm, the slip dislocation occurs in the straight body, but the yield becomes 90% or more. When the length of the tail is 180 mm, the SF occurs in the straight body, but the yield becomes 90% or more. In both of cases, the production efficiency is not significantly affected. From the above, it is deduced that the yield becomes 90% or more when the single crystal is withdrawn from the dopant-added melt in a state that the distance between the upper end of the straight body and the dopant-added melt is 730 mm or less.

Further, it was found that, when the length of the straight body is 1,000 mm, as the tail becomes shorter, the length of the product becomes longer.

The invention has been reached based on the above findings.

A method for producing a single crystal according to an aspect of the invention using a single-crystal pull-up apparatus including a chamber, a crucible disposed in the chamber and configured to receive a dopant-added melt in which red phosphorus is added to a silicon melt, and a pull-up section that is configured to pull up a seed crystal after bringing the seed crystal into contact with the dopant-added melt. The method for producing a single crystal includes: bringing the seed crystal into contact with the dopant-added melt, in which the red phosphorus is added to the silicon melt, such that a resistivity of the single crystal is 0.9 mΩ·cm or less and subsequently pulling up the seed crystal, to form a straight body of the single crystal; and withdrawing the single crystal from the dopant-added melt in a state that a temperature of an upper end of the straight body is 590 degrees C. or more.

In the above arrangement, even when the red phosphorus is added to the silicon melt to produce the single crystal having low resistivity (i.e., in a range from 0.6 mΩ·cm to 0.9 mΩ), since a cooling step, in which the single crystal after being subjected to the withdrawal step to be withdrawn from the dopant-added melt is cooled, is performed, the time during which the temperature of the entire area of the straight body falls within 570±70 degrees C. is controllable to fall a range from 20 minutes to 200 minute. Subsequently, a prebaking treatment (i.e., heat treatment in the hydrogen atmosphere at the temperature of 1200 degrees C. for 30 seconds) is applied to the silicon wafer obtained from the entire area of the straight body of the single crystal thus produced, so that the number of the above-described pits generated on the silicon wafer can be suppressed to $0.1/cm^2$ or less.

Accordingly, when an epitaxial silicon wafer is produced using the single crystal as described above, the number of LPD (of 90 nm or more) measured by DCN mode of SP-1 manufactured by KLA-Tencor Corporation can be lowered to $0.1/cm^2$ or less. Accordingly, the epitaxial silicon wafer in which the resistivity is low and the generation of the LPD caused by the SF is restrained is obtainable. Further, the epitaxial silicon wafer in which the resistivity is low and the generation of the LPD caused by the SF is restrained in the entire area of the straight body is obtainable. Namely, the yield can be 100%, and an efficiency rate is improvable as compared with conventional epitaxial silicon wafers.

It should be noted that germanium (Ge) may be added to the silicon melt together with red phosphorus. In the above arrangement, occurrence of dislocation defect (misfit dislocation) due to red-phosphorus concentration difference at an interface between the silicon wafer and the epitaxial film can be restrained.

In the above arrangement, in the withdrawing of the single crystal, the single crystal is preferably withdrawn from the dopant-added melt in a state that a distance between the upper end of the straight body and a surface of the dopant-added melt is 690 mm or less.

In the above arrangement, by a simple process for controlling the position of the upper end of the straight body in the withdrawal step, the yield can be 100%, and the efficiency rate of the epitaxial silicon wafer is improvable as compared with conventional ones.

In the above arrangement, in the withdrawing of the single crystal, the single crystal is preferably withdrawn from the dopant-added melt in a state that the straight body has a length of 550 mm or less.

It is preferable that the method further includes forming a tail at a lower end of the straight body, the tail having a length in a range from 100 mm to 140 mm.

In the above arrangement, even when slip dislocation occurs in the straight body, the yield can be 90% or more that is greater than the conventional one. Accordingly, the epitaxial silicon wafer in which generation of the LPD caused by the SF is restrained can be obtained while the production efficiency is not significantly affected.

A method for producing a single crystal according to another aspect of the invention using a single-crystal pull-up apparatus including a chamber, a crucible disposed in the chamber and configured to receive a dopant-added melt in which red phosphorus is added to a silicon melt, and a pull-up section that is configured to pull up a seed crystal after bringing the seed crystal into contact with the dopant-added melt. The method includes: bringing the seed crystal into contact with the dopant-added melt, in which the red phosphorus is added to the silicon melt, such that a resistivity of the single crystal is 0.9 mΩ·cm or less and subsequently pulling up the seed crystal, to form a straight body of the single crystal; and withdrawing the single crystal from the dopant-added melt in a state that a distance between an upper end of the straight body and a surface of the dopant-added melt is 730 mm or less.

In the above arrangement, by a simple process for controlling the position of the upper end of the straight body in the withdrawal step, even when the SF is generated in the straight body due to the excessively long tail or the slip dislocation occurs in the straight body due to the excessively short tail, the yield can be 90% or more that is greater than the conventional one. Accordingly, the epitaxial silicon wafer in which the generation of the LPD caused by the SF is restrained can be obtained while the production efficiency is not affected significantly. It should be noted that, in accordance with the producing conditions according to the above aspect of the invention, for example, it is possible to produce a single crystal provided with a straight body having a length of 550 mm and a tail having a length of 180 mm.

In the above arrangement, it is preferable that the single crystal is withdrawn from the dopant-added melt in a state that the straight body has a length of 550 mm or less.

It is preferable that the method further includes forming a tail at a lower end of the straight body, the tail having a length in a range from 100 mm to 180 mm.

In the above arrangement, since the tail is formed as described above, the epitaxial silicon in which the generation of the LPD caused by the SF is restrained is obtainable while the production efficiency is not affected significantly.

In the above arrangement, preferably, in the withdrawing of the single crystal, the single crystal provided with no tail at a lower end of the straight body is withdrawn from the dopant-added melt.

In the above arrangement, since the withdrawal step is performed without performing the tail-formation step, the time for producing one single crystal can be shortened in comparison with a case where the tail is formed.

In the above arrangement, preferably, the single crystal is produced plural times to produce a plurality of the single crystals, the dopant-added melt in an amount capable of producing one of the plurality of single crystals is received in the crucible, and each time one of the plurality of single crystals is produced, a silicon polycrystal material and the red phosphorus are added to the crucible to produce a next one of the plurality of single crystals.

In the above arrangement, since the concentration of the red phosphorus in the dopant-added melt can be made constant at the time of producing each single crystal, the single crystal is producible without the control in view of evaporation of the red phosphorus.

In the above arrangement, preferably, the dopant-added melt in an amount capable of producing the plurality of single crystals is received in the crucible, and the plurality of single crystals are produced one by one without adding a silicon polycrystal material and the red phosphorus to the crucible.

In the above arrangement, the plurality of single crystals are producible without opening the chamber, so that efficiency in producing the single crystals is improvable.

A method for producing a silicon wafer according to a still another aspect of the invention includes cutting off a silicon wafer from a straight body of a single crystal produced by the producing method of a single crystal.

A method for producing an epitaxial silicon wafer according to a further aspect of the invention includes: heating a silicon wafer produced by the producing method of a silicon wafer described above in a hydrogen atmosphere in a first step; and forming an epitaxial film on the silicon wafer after the first step to produce an epitaxial silicon wafer in a second step.

In the above arrangement, the epitaxial silicon wafer in which the resistivity is low and the generation of the LPD caused by the SF is restrained as described above can be provided. Further, since a polysilicon film is not formed on the epitaxial silicon wafer, the process can be simplified.

BRIEF DESCRIPTION OF DRAWING(S)

FIG. 19 illustrates results of Experiments 7 and 8 for deriving the relationship between the length of the tail, the SF, and the generation status of slip dislocation.

Figure 20:
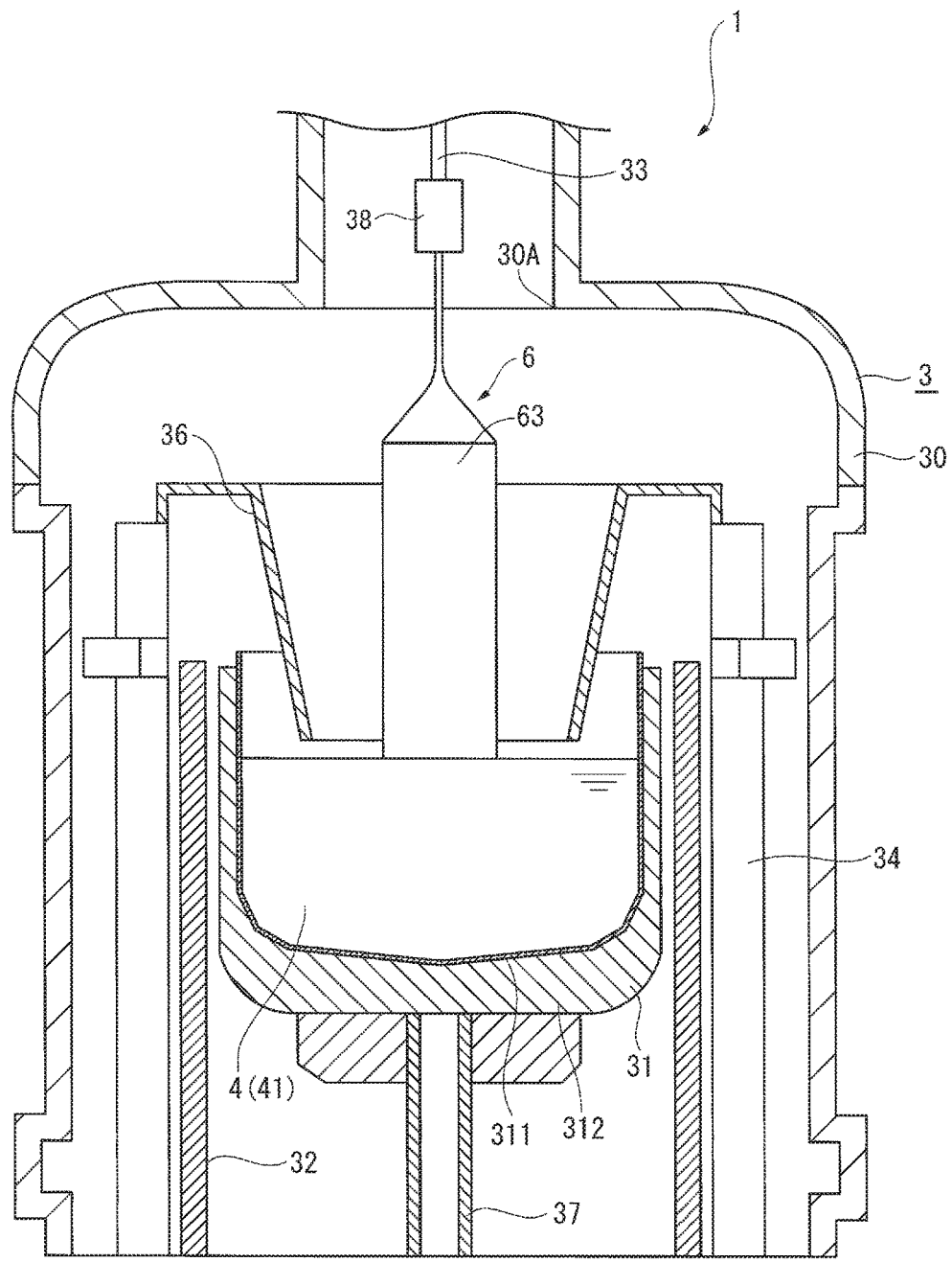

FIG. 20 schematically illustrates an outline of a single-crystal pull-up apparatus according to an exemplary embodiment of the invention.

Figure 21:
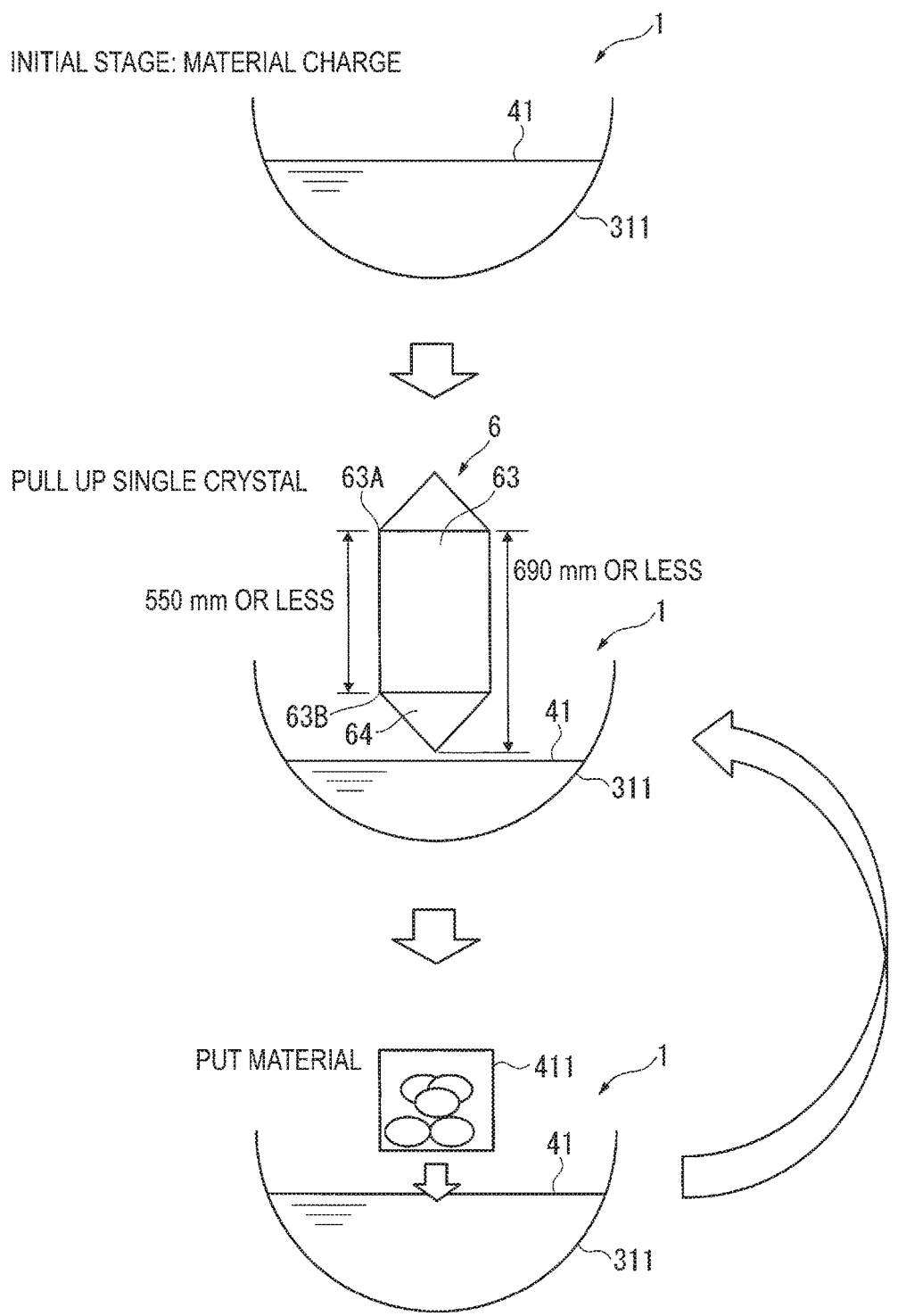

FIG. 21 schematically illustrates a producing method of a single crystal by a multi-pull-up process according to the exemplary embodiment.

FIG. 22 schematically illustrates a producing method of a single crystal by a single-charge pull-up process according to a modification of the invention.

DESCRIPTION OF EMBODIMENT(S)

Exemplary embodiment(s) of the invention will be described below with reference to the attached drawings.
Arrangement of Single-Crystal Pull-Up Apparatus Initially, an arrangement of a single-crystal pull-up apparatus will be described below.

A single-crystal pull-up apparatus 1 includes a single-crystal pull-up apparatus body 3 as shown in FIG. 20, a doping device (not shown) and a controller (not shown).

The single-crystal pull-up apparatus body 3 includes a chamber 30, a crucible 31 disposed in the chamber 30, a heater 32 that is configured to radiate heat toward the crucible 31 to heat the crucible 31, a pull-up cable 33 (pull-up section), a heat insulating cylinder 34 and a shield 36.

Inert gas (e.g. argon gas) is introduced into the chamber 30 from an upper side toward a lower side through an intake 30A provided to an upper side of the chamber 30 at a predetermined gas flow rate under the control of the controller. Further, the pressure within the chamber 30 (furnace pressure) is controllable by the controller.

The crucible 31 melts a polycrystal silicon as a material of a silicon wafer to provide a silicon melt 4. The crucible 31 includes a bottomed cylindrical quartz crucible 311 (i.e., a crucible made of quartz), and a graphite crucible 312 (i.e., a crucible made of graphite) disposed outside the quartz crucible 311 to receive the quartz crucible 311. The crucible 31 is supported by a support shaft 37 rotated at a predetermined speed.

The heater 32 is disposed outside the crucible 31. The heater 32 heats the crucible 31 to melt the silicon in the crucible 31.

A first end of the pull-up cable 33 is connected to a pull-up drive unit (not shown) disposed, for instance, above the crucible 31. Further, to a second end of the pull-up cable 33 is attached a seed holder 38 for holding a seed crystal or a doping device (not shown). The pull-up cable 33 is rotatable by being driven by the pull-up drive unit. The pull-up cable 33 moves up at a predetermined pull-up speed by the pull-up drive unit under the control of the controller.

The heat insulating cylinder 34 is disposed to surround the crucible 31 and the heater 32.

The shield 36 serves as a heat shield for shielding radiation heat upwardly radiated from the heater 32.

The doping device volatilizes red phosphorus (solid volatile dopant) to dope (i.e., add) the red phosphorus to the silicon melt 4 in the crucible 31 to provide dopant-added melt 41. It should be noted that the doping device may include a cylindrical member having a lower end immersed in the silicon melt 4 to add red phosphorus in the silicon melt 4, or may be designed so that the cylindrical member has a lower end spaced apart from the silicon melt 4 and volatilized red phosphorus is blown to the silicon melt 4, thereby adding red phosphorus to the silicon melt 4.

The controller appropriately controls the gas flow rate and furnace pressure in the chamber 30 and the pull-up speed of the pull-up cable 33 based on a setting by an operator to control a production process of the single crystal 6.
Producing Method of Single Crystal Next, an example of a method for producing the single crystal 6 using the single-crystal pull-up apparatus 1 will be described below. It should be noted that, in this exemplary embodiment, a method for producing the single crystal 6 having a diameter of 200 mm will be described.

Initially, a method for producing the single crystal 6 through a so-called multi-pull-up process, in which a polysilicon material 411 (silicon polycrystal material) is charged in a single quartz crucible 311 each time the single crystal 6 is pulled up so as to pull up a plurality of single crystals 6, will be described below.

As shown in FIG. 21, 80 kg of the polysilicon material is initially charged in the quartz crucible 311 in the single-crystal pull-up apparatus 1. Then, under the control of the controller, the polysilicon material is heated to be melted, and red phosphorus (volatile dopant) is added in the silicon melt 4 to provide the dopant-added melt 41 while the gas flow rate and furnace pressure in the chamber 30 are set at predetermined values.

It should be noted that germanium may be added together with red phosphorus in order to restrain misfit dislocation in the epitaxial silicon wafer. Further, the additive amount of red phosphorus is set so that resistivity of silicon wafer(s) cut off from the single crystal 6 falls within a range from 0.6 mΩ·cm to 0.9 mΩ·cm.

Subsequently, after immersing a seed crystal in the melt, the controller of the single-crystal pull-up apparatus 1 pulls up the seed crystal at a predetermined pull-up speed based on the setting by the operator to produce the single crystal 6.

The pull-up process of the seed crystal includes a neck-formation step, a shoulder-formation step, a straight-body-formation step, a tail-formation step and a cooling step. The controller controls at least a pull-up time during the straight-body-formation step to be shorter than that in a conventional process to produce a single crystal 6 of which dimension is smaller than a conventional single crystal.

Specifically, the pull-up time during the straight-body-formation step is made shorter than that in a conventional process, and the pull-up time during the tail-formation step is made the same as that in a conventional process. Then, in a state that the length of the straight body 63 is 550 mm or less and a distance between the upper end 63A of the straight body 63 and the surface of the dopant-added melt 41 is 690 mm or less, a withdrawal step for withdrawing the single crystal 6 from the dopant-added melt 41 is performed. Through such a process, for example, a single crystal 6 provided with the straight body 63 having a length of 550 mm and the tail 64 having a length of 140 mm is produced.

Under the above-described conditions, in a state that the temperature of the upper end 63A of the straight body 63 is 590 degrees C. or more, the single crystal 6 is withdrawn from the dopant-added melt 41, such that the time during which the temperature at each position in an entire area of the straight body 63 falls within 570±70 degrees C. is in a range from 20 minutes to 200 minute. The thermal history of the entire area of the straight body 63 is substantially the same as that shown by solid lines in FIG. 17, and the thermal history at the center of the single crystal 6 is substantially the same as that shown by solid lines in FIG. 18.

It should be noted that the conditions other than the pull-up time (e.g. the heating condition by the heater 32) may be the same as the conventional ones.

Figure 1:
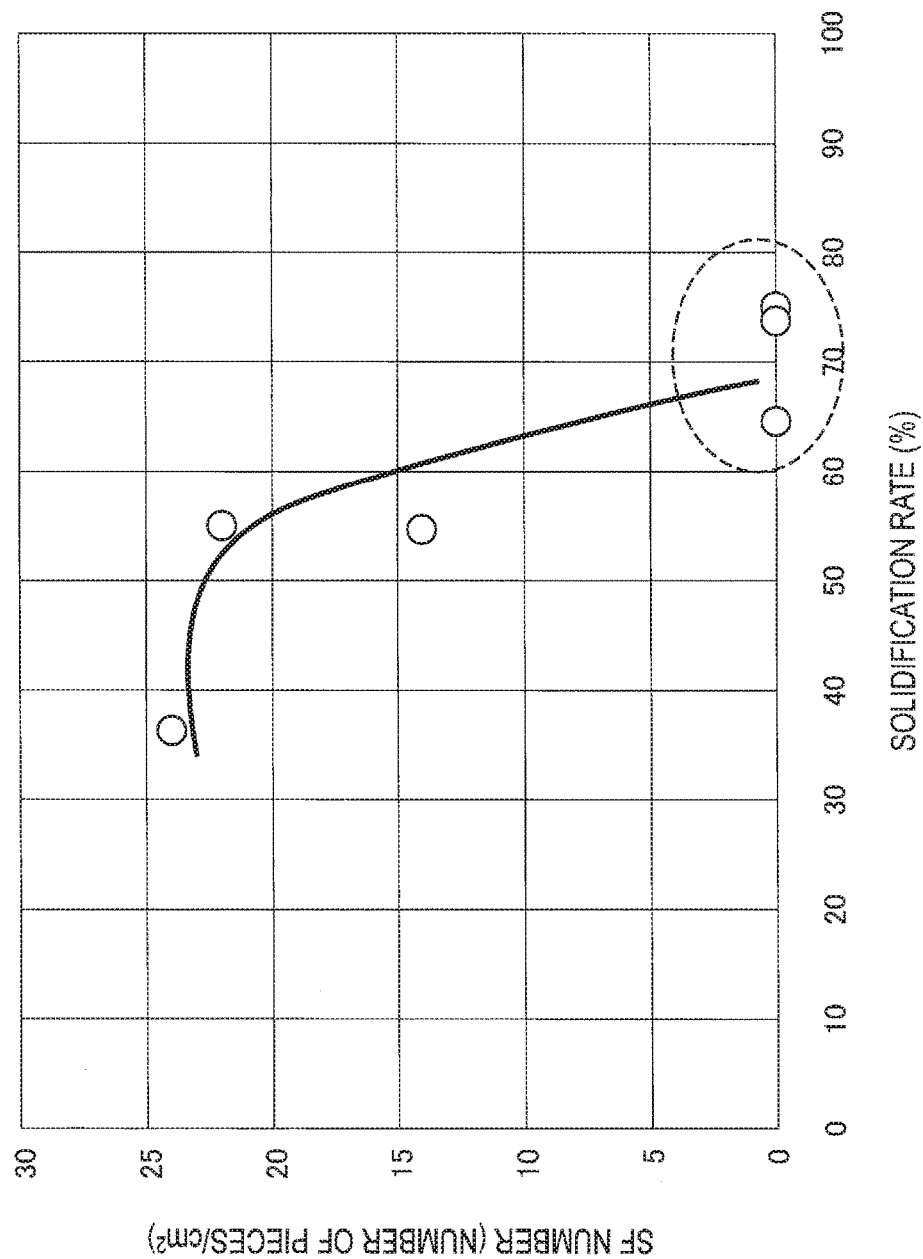
FIG. 1 is a graph illustrating results of an experiment for deriving a producing condition of an epitaxial silicon wafer of the invention, which shows a relationship between a solidification rate of a single crystal and an SF number.
Figure 2:
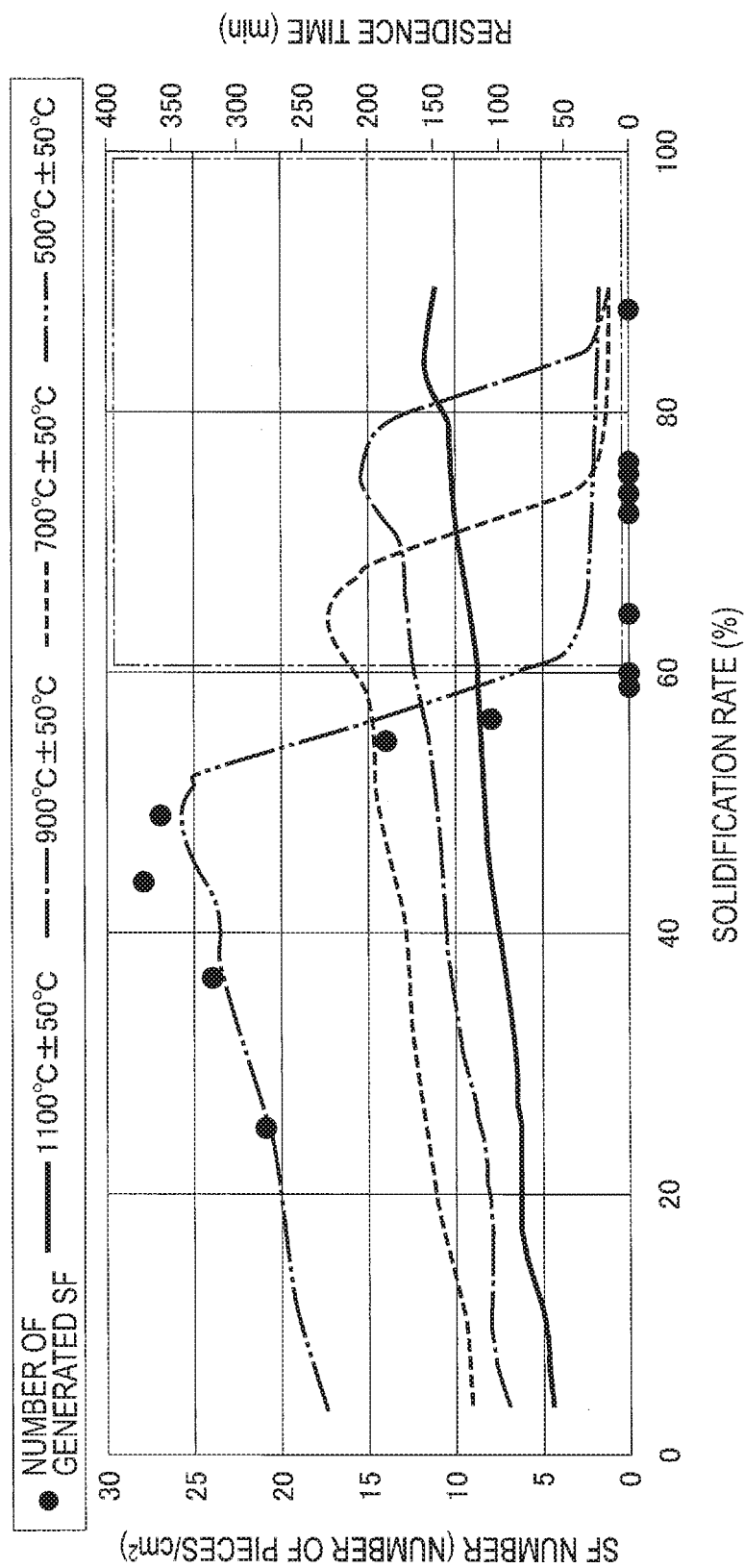
FIG. 2 is a graph illustrating results of Experiment 1 for deriving the producing condition described above, which shows a relationship between the solidification rate, the SF number and a residence time at each of temperature.
Figure 3:
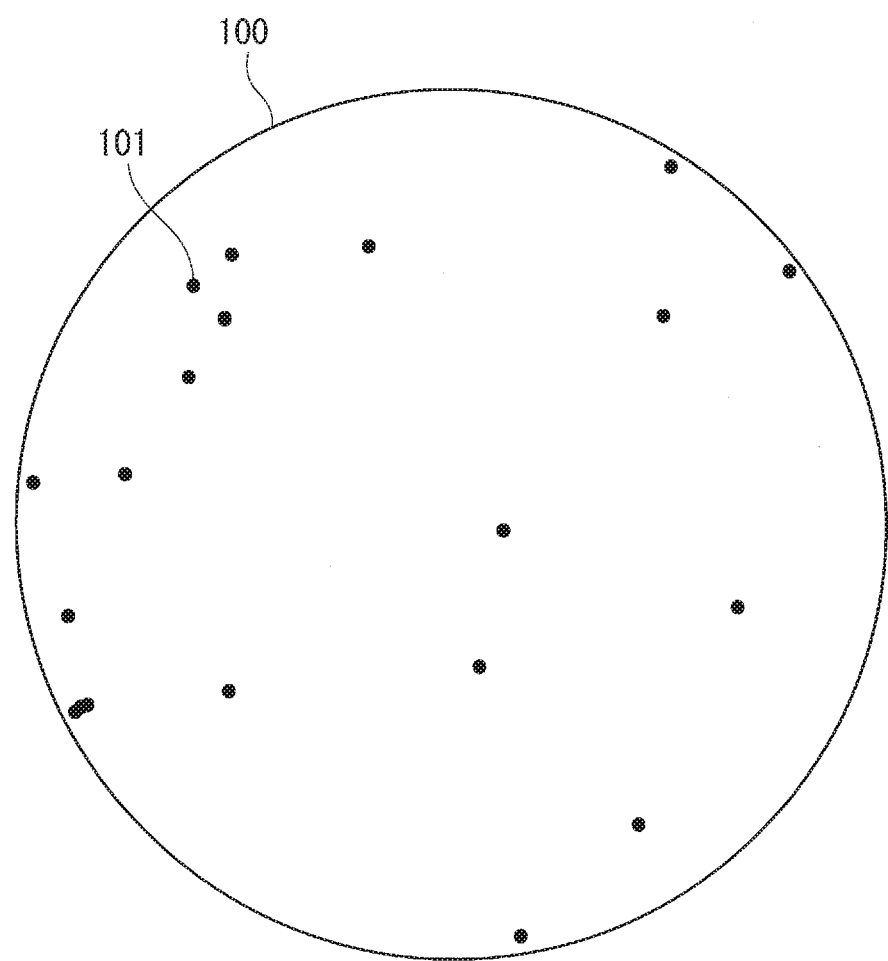
FIG. 3 illustrates results of Experiment 2 for deriving the producing condition described above, which shows a generation state of LPD on a silicon wafer before prebaking.
Figure 4:
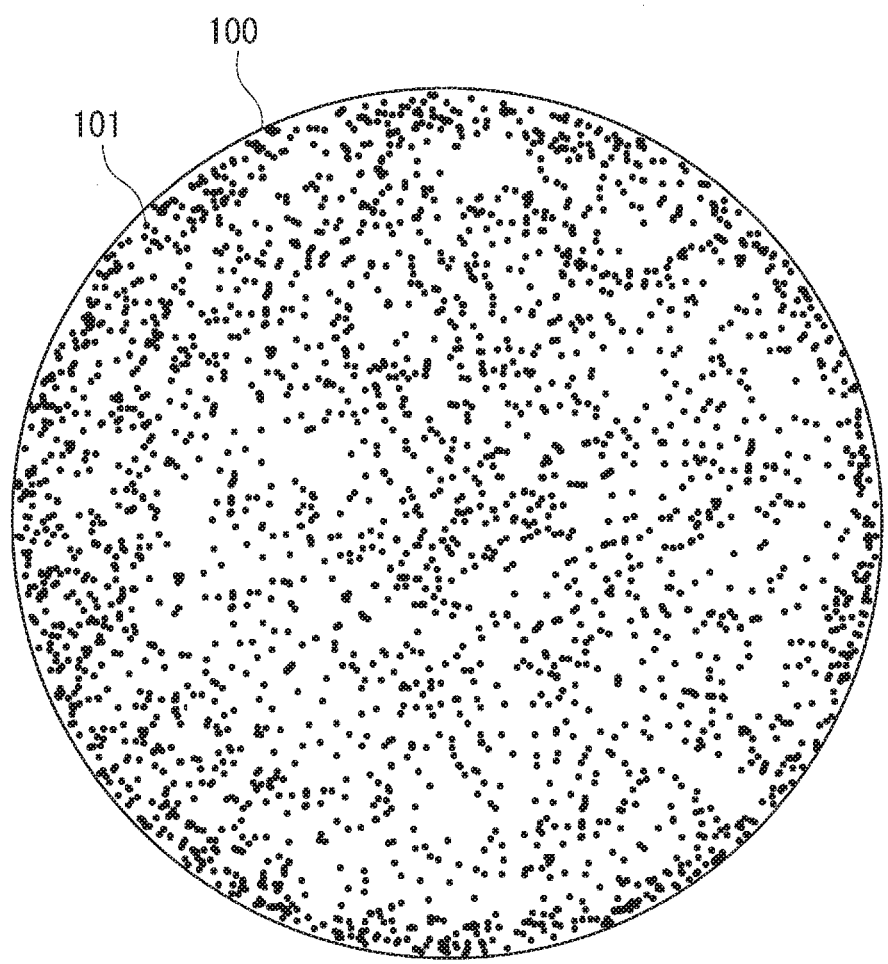
FIG. 4 illustrates results of Experiment 2, which shows a generation state of LPD after the prebaking on the silicon wafer corresponding to a solidification rate at which SF is generated.
Figure 5:
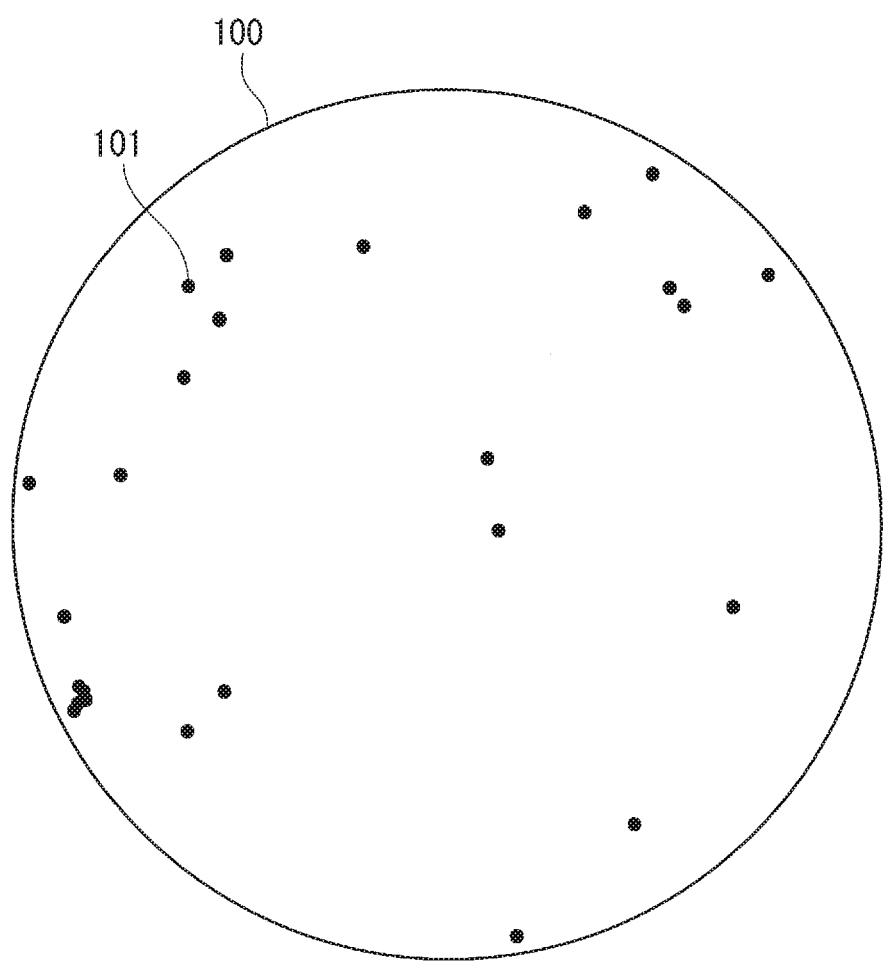
FIG. 5 illustrates results of Experiment 2, which shows a generation state of LPD after the prebaking on the silicon wafer corresponding to a solidification rate at which the SF is not generated.
Figure 6:
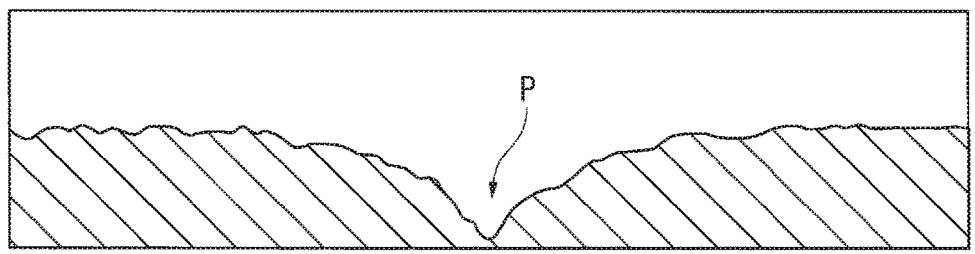
FIG. 6 illustrates the results of Experiment 2, which shows AFM observation results of LPD increased after the prebaking.
Figure 7:
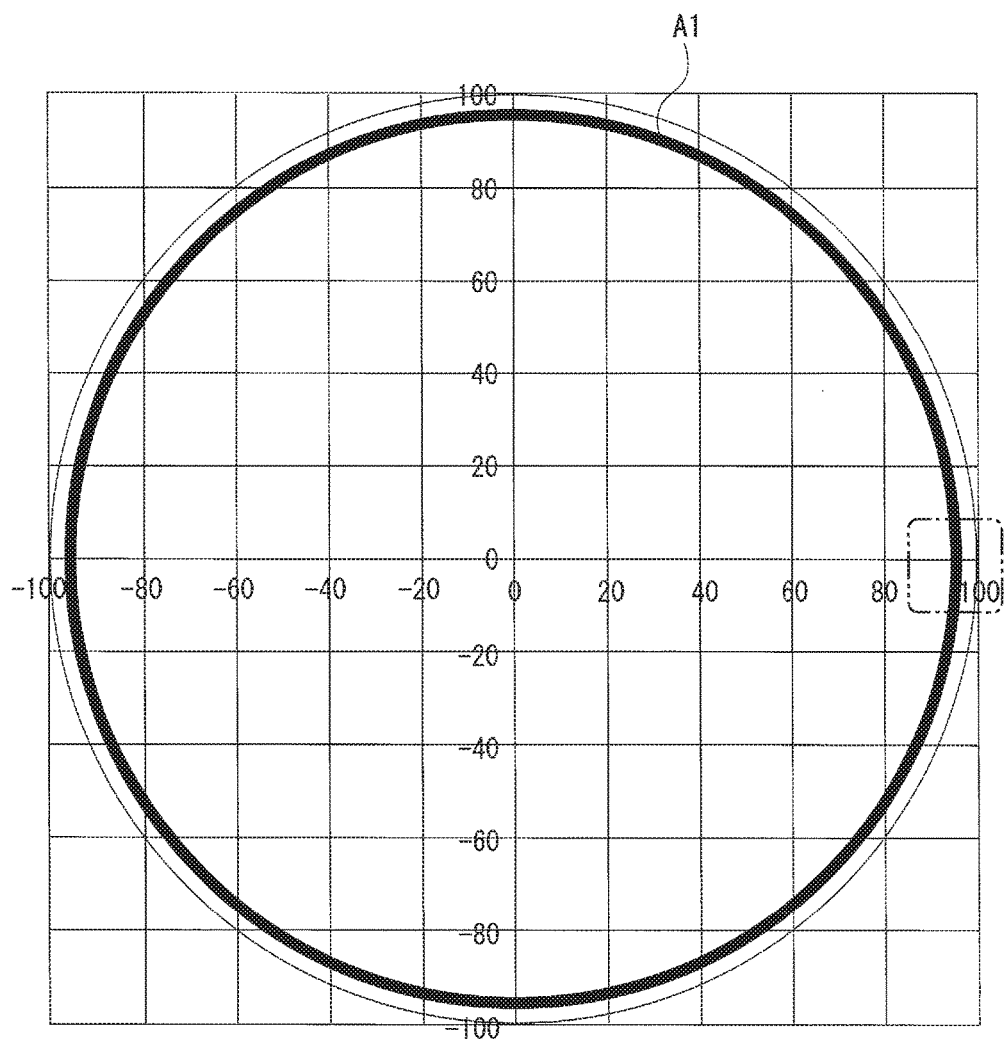
FIG. 7 illustrates results of Experiment 3 for deriving the producing condition described above, which shows a generation state of LPD after growing an epitaxial film and experimental results shown in FIG. 4 in an overlapped manner.
Figure 8:
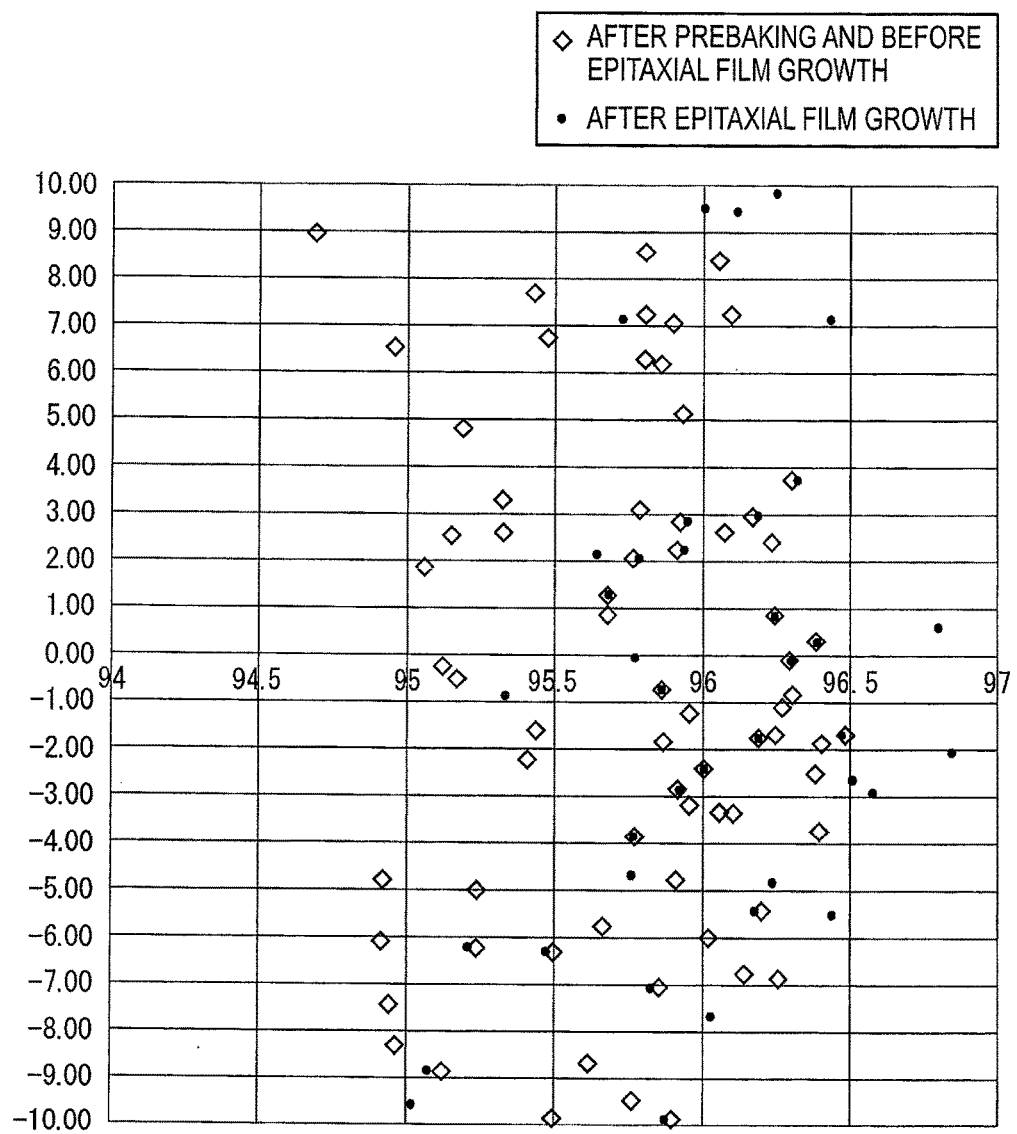
FIG. 8 illustrates the results of Experiment 3, which shows a part of FIG. 7 in an enlarged manner.
Figure 9:
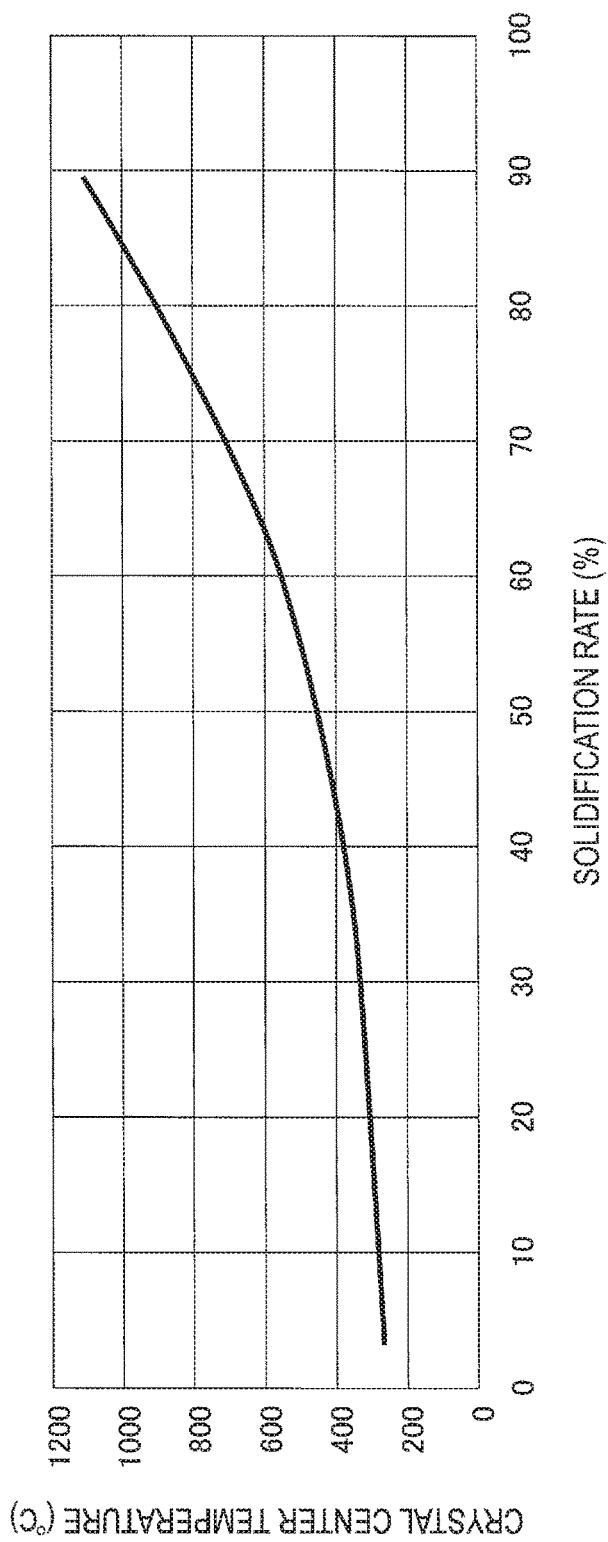
FIG. 9 is a graph illustrating results of Experiment 4 for deriving the producing condition described above, which shows a relationship between the solidification rate and a center temperature of the crystal.
Figure 10:
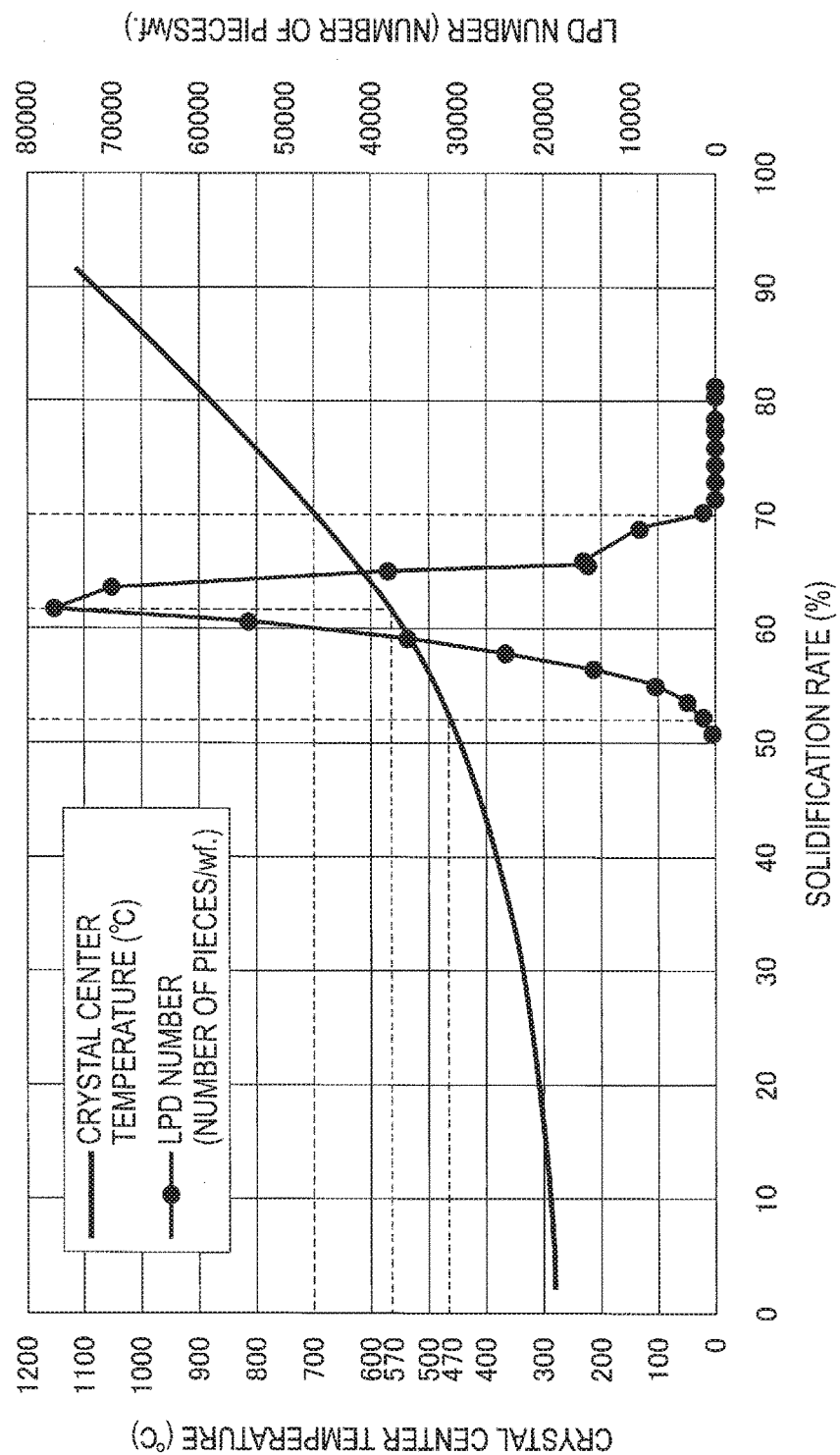
FIG. 10 is a graph illustrating the results of Experiment 4, which shows a relationship between the solidification rate, the center temperature of the crystal, and the LPD number in the single crystal.
Figure 11:
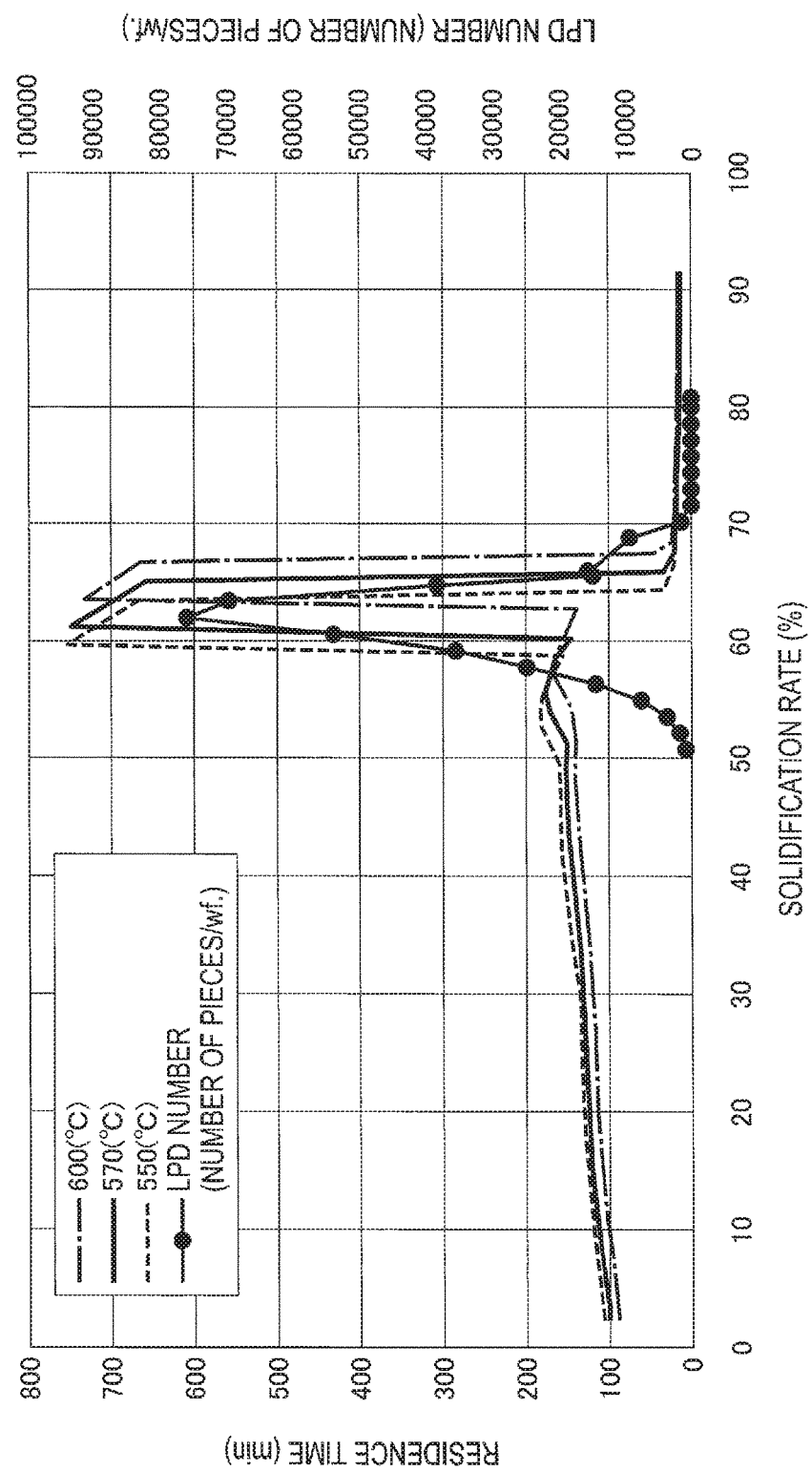
FIG. 11 is a graph illustrating the results of Experiment 4, which shows a relationship between the solidification rate, a residence time at each temperature and the LPD number when a temperature width is ±30 degrees C.
Figure 12:
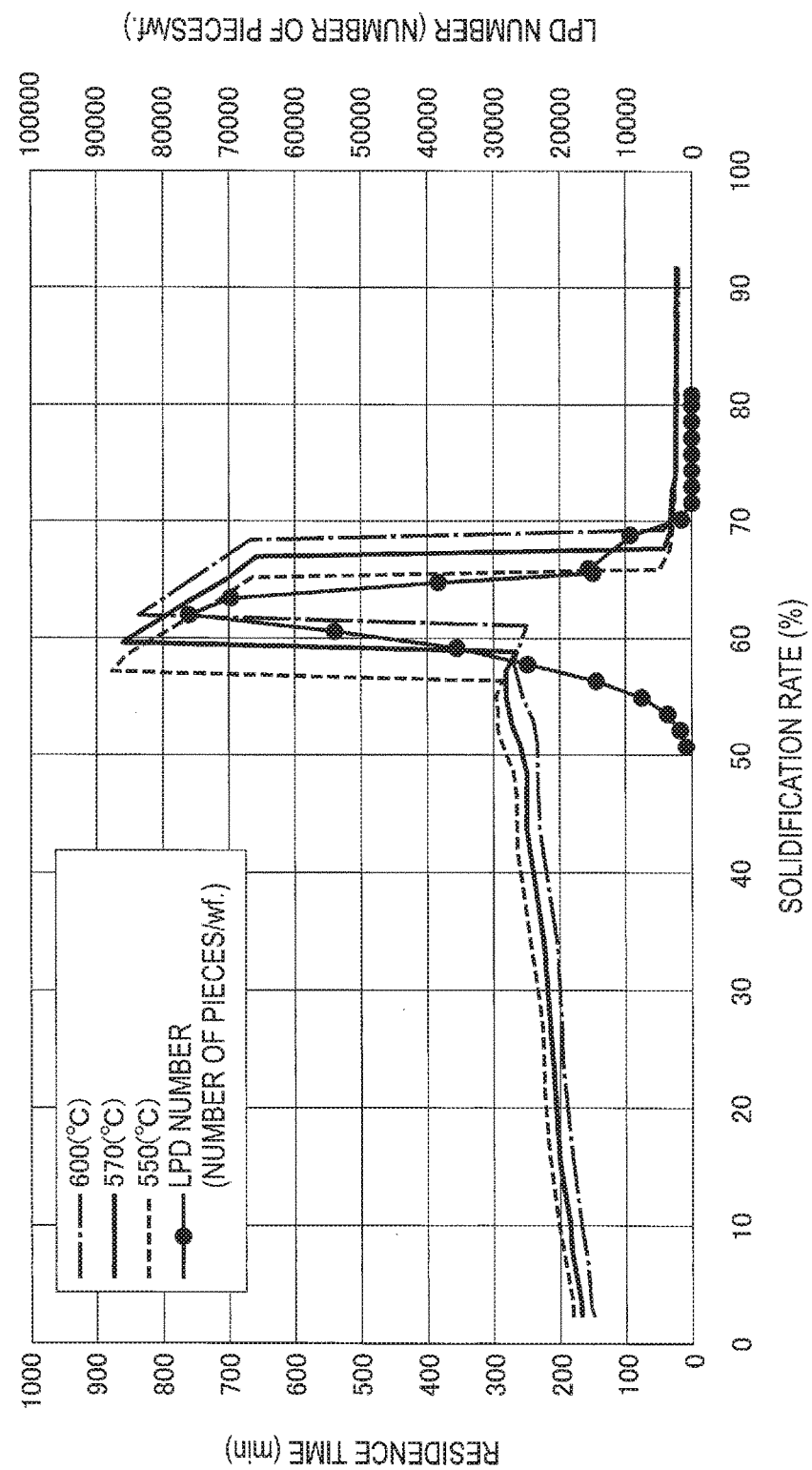
FIG. 12 is a graph illustrating the results of Experiment 4, which shows a relationship between the solidification rate, a residence time at each temperature and the LPD number when the temperature width is ±50 degrees C.
Figure 13:
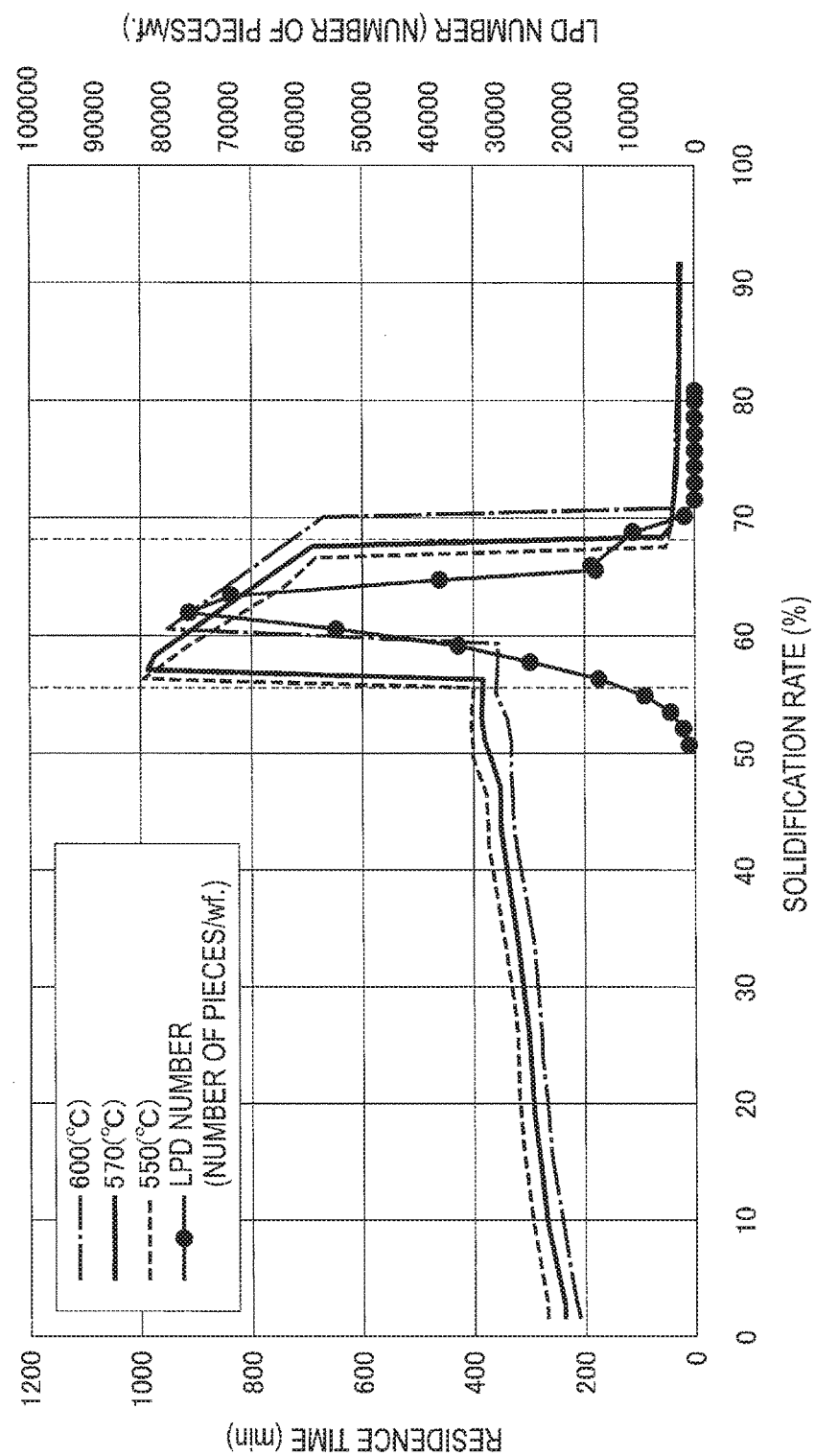
FIG. 13 is a graph illustrating the results of Experiment 4, which shows a relationship between the solidification rate, a residence time at each temperature and the LPD number when a temperature width is ±70 degrees C.
Figure 14:
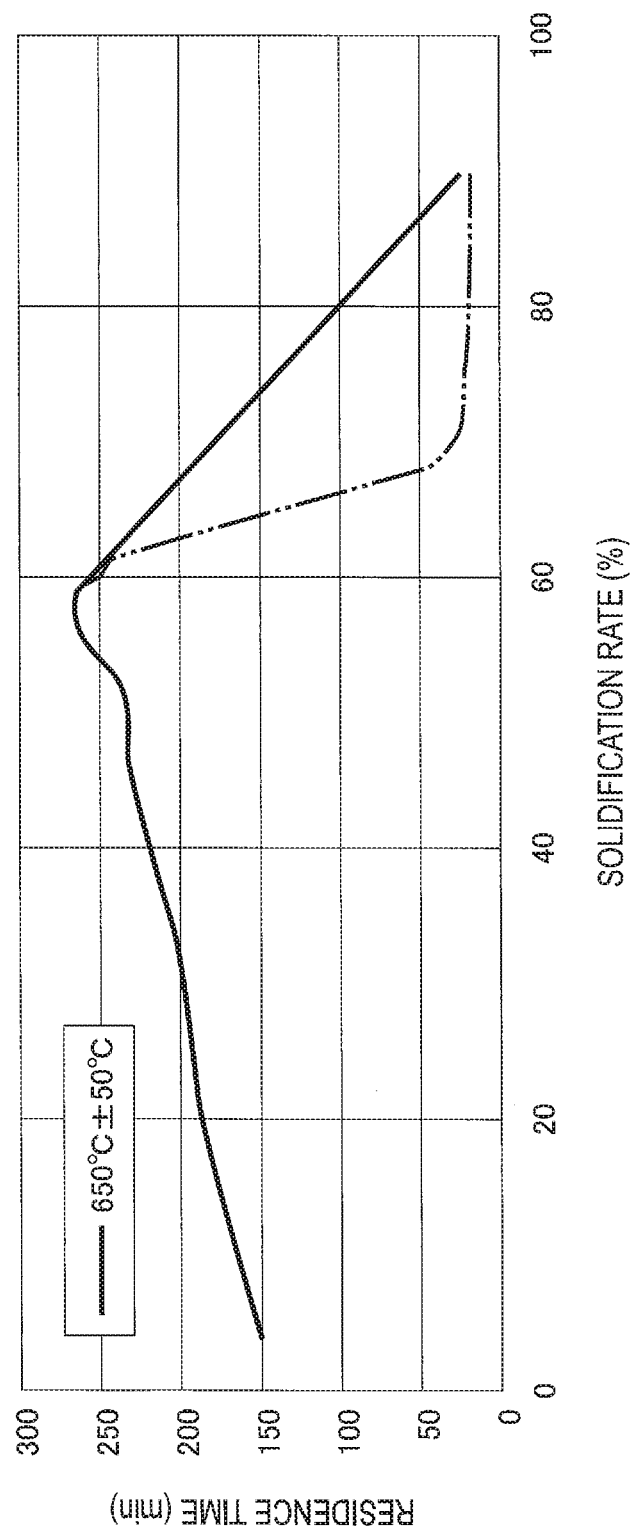
FIG. 14 is a graph illustrating the results of Experiment 4, which shows a relationship between the solidification rate and the residence time of the single crystal.
Figure 15:
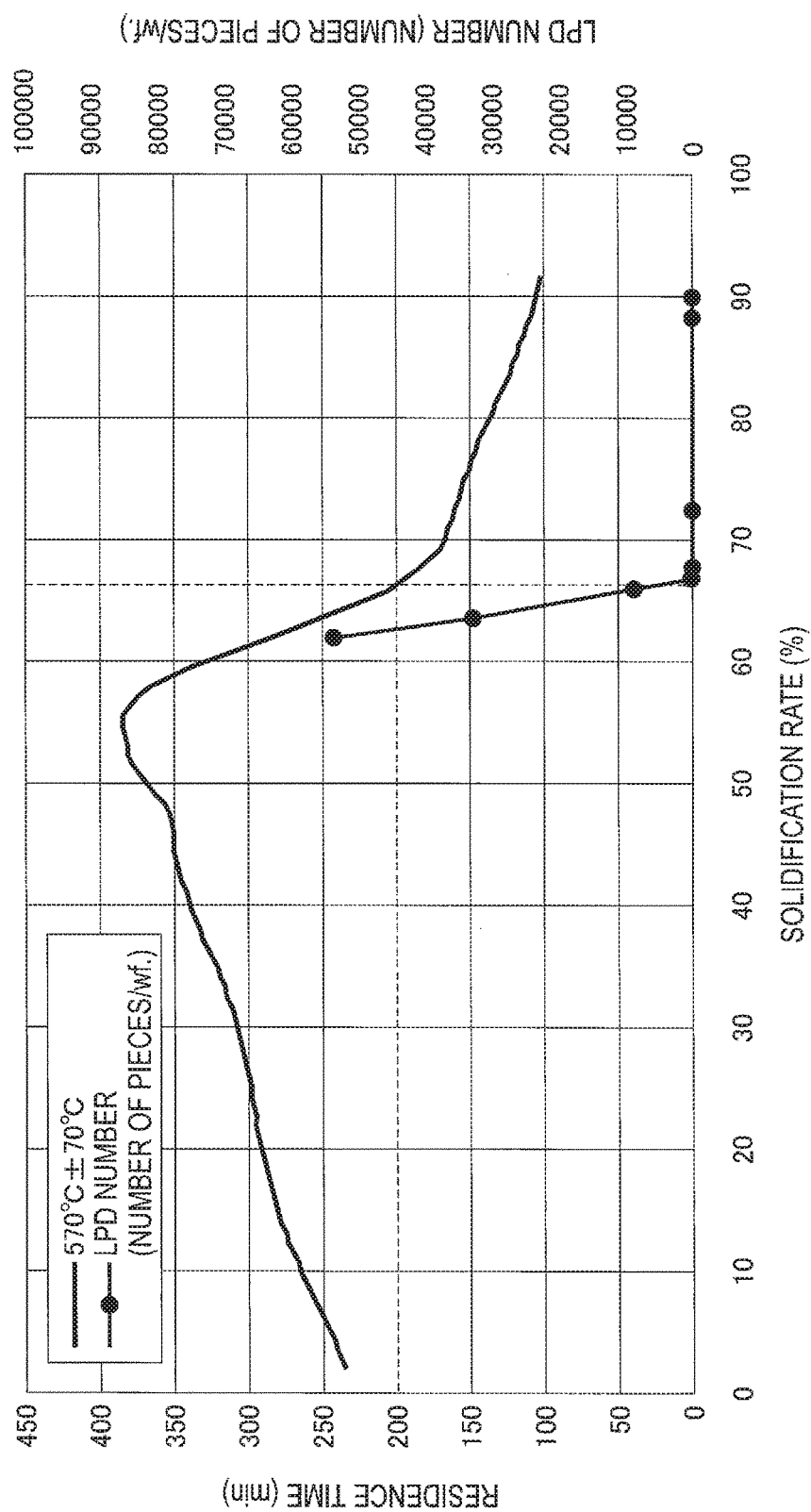
FIG. 15 is a graph illustrating the results of Experiment 4, which shows a relationship between the solidification rate, the residence time at each temperature and the LPD number.
Figure 16:
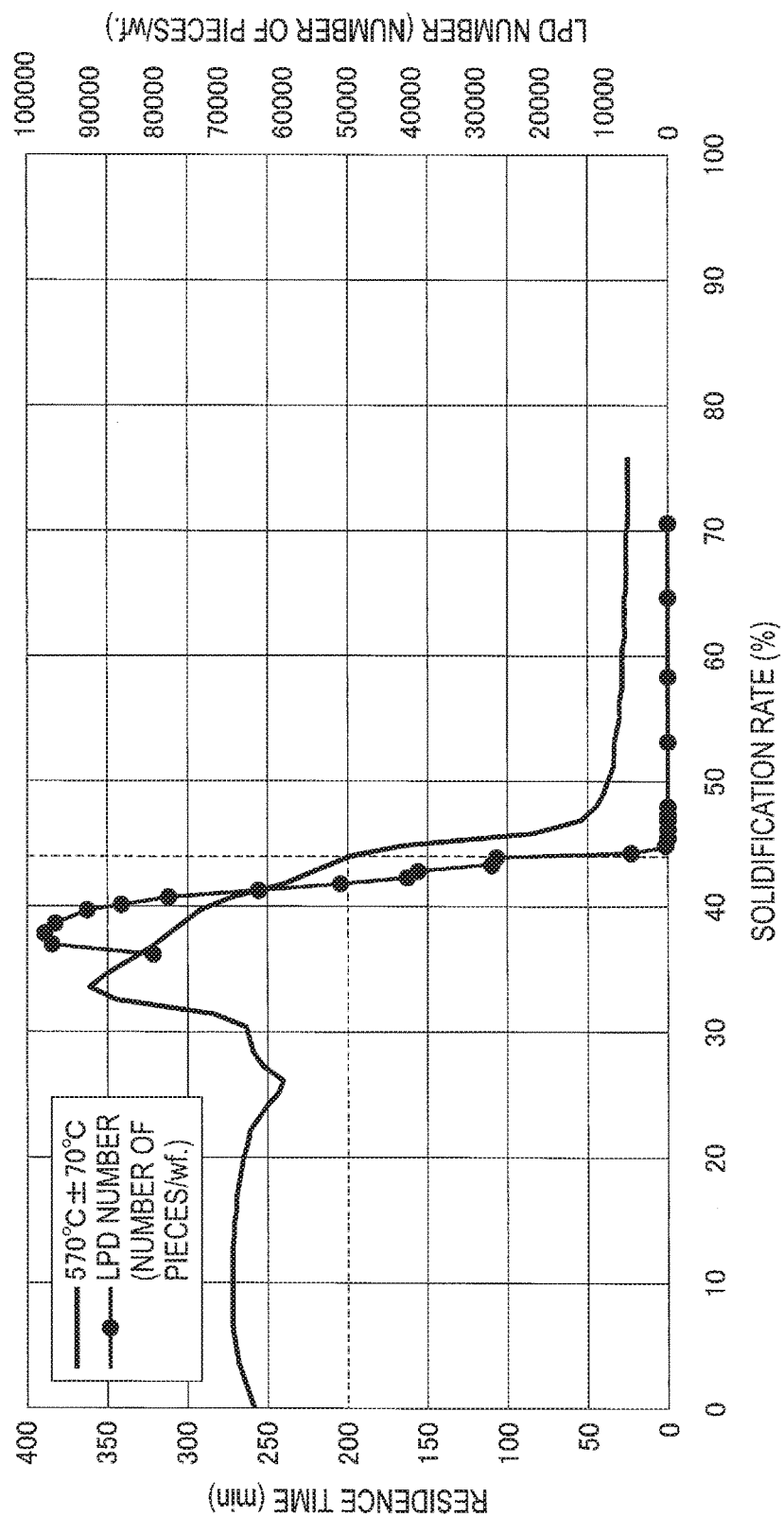
FIG. 16 is a graph illustrating the results of an experiment performed to verify the results of Experiment 4, which shows a relationship between the solidification rate, the residence time at each temperature and the LPD number.

Specifically, when a single crystal of a typical dimension is produced, at the start of the cooling step after the completion of the tail-formation step, the lower end of the single crystal (the portion in FIG. 2, at which the solidification rate exceeds 60%) is heated at a temperature of 590 degrees C. or more and is rapidly cooled from the heated state, so that it is speculated that the period in which the temperature is 570±70 degrees C. becomes short (i.e., 200 minutes or less). On the other hand, the upper end of the single crystal (the portion in FIG. 2, at which the solidification rate is less than 60%) is already cooled to a temperature less than 590 degrees C. at the start of the cooling step. Accordingly, even when the single crystal is rapidly cooled from this state, it is considered that the time during which the temperature of the upper end of the single crystal is 570±70 degrees C. becomes longer than the time during which the temperature of the lower end of the single crystal is 570±70 degrees C. (i.e., exceeds 200 minutes). As a result, it is speculated that a large number of SF are generated at the upper end, whereas the generation of SF is restrained at the lower end.

In contrast, in the producing method according to this exemplary embodiment as shown in FIG. 21, it is speculated that the single crystal 6 that is shorter than the typical one is produced, and the entire area of the straight body 63 of the single crystal 6 can be set at a temperature of 590 degrees C. or more at the start of the cooling step after the completion of the tail-formation step. The single crystal 6 is rapidly cooled from this state, and accordingly the period during which the temperature of the single crystal 6 is at 570±70 degrees C. can be short in a manner similar to that for a lower end of a typical single crystal.

Figure 17:
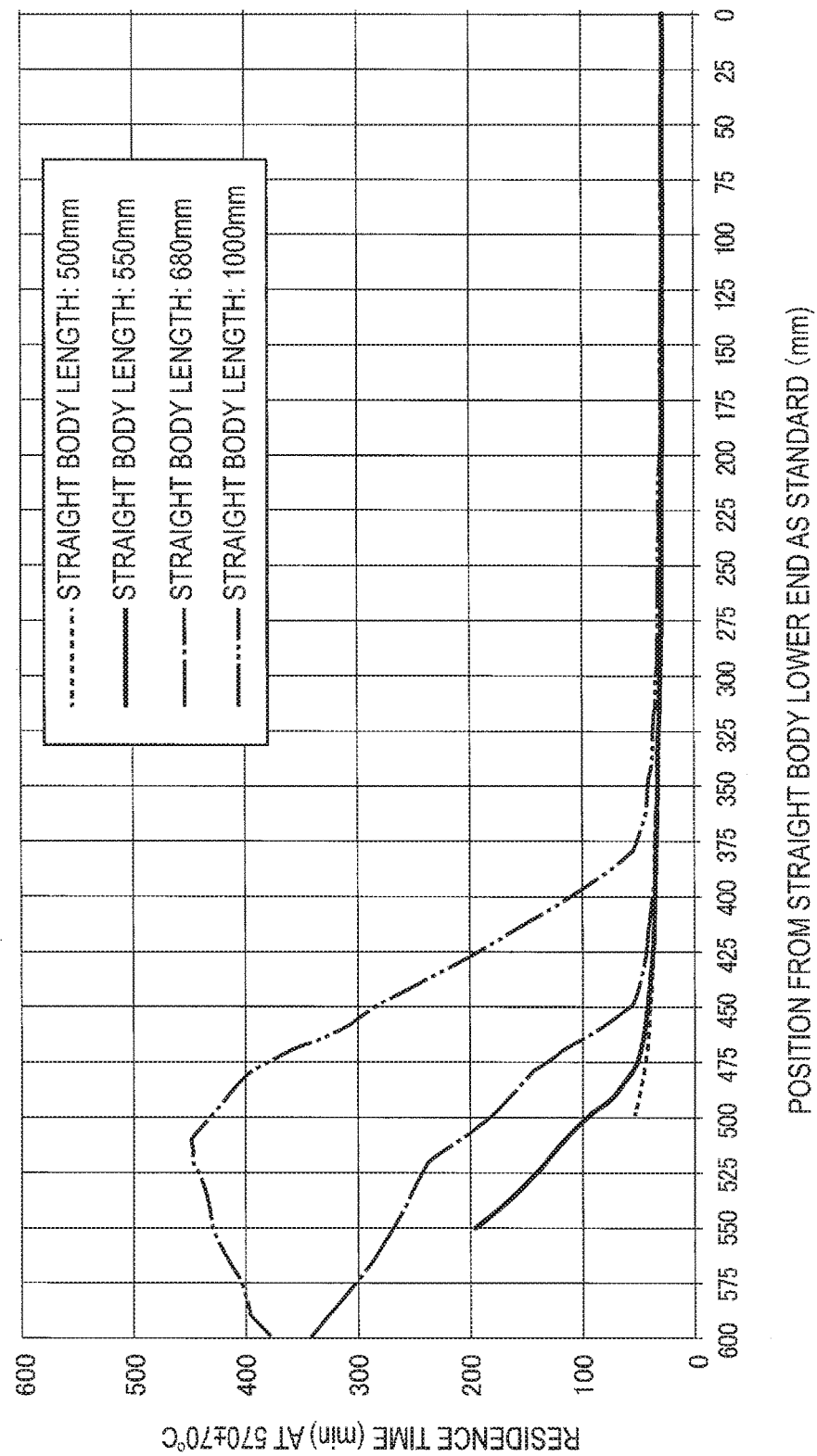
FIG. 17 is a graph illustrating results of Experiment 5 for deriving a producing condition of the single crystal capable of restraining generation of LPD caused by SF in an entire area of a straight body, which shows a relationship between a position of the single crystal and the residence time at the temperature of 570±70 degrees C.
Figure 18:
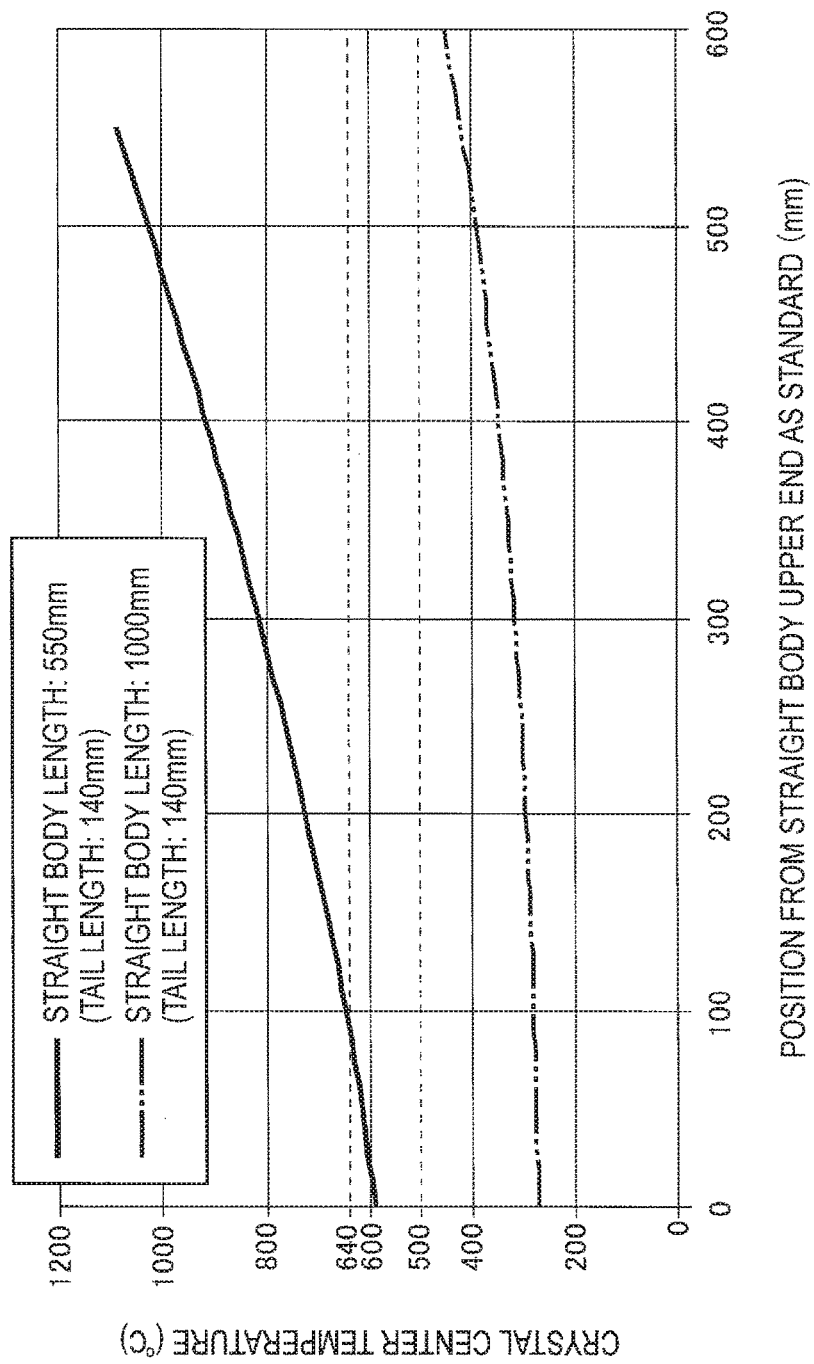
FIG. 18 is a graph illustrating results of Experiment 6 for studying a temperature of the center of the single crystal at the time of withdrawing the single crystal from the dopant-added melt, which shows a relationship between a position of the single crystal and the temperature of the center of the single crystal.

As a result, as described above, the thermal history of the entire area of the straight body 63 becomes one shown by solid lines in FIG. 17, and the thermal history at the center of the single crystal 6 becomes one shown by solid lines in FIG. 18, and the time during which the temperature of each position of the area falls within 570±70 degrees C. is considered to be in a range from 20 minutes to 200 minutes. Accordingly, generation of the LPD can be restrained in the entire area of the straight body 63.

Further, since the tail 64 having the length of 140 mm is formed, generation of the LPD caused by the SF and the slip dislocation in the entire area of the straight body 63 can be restrained, so that the yield can be 100%.

After the completion of the production of one of the single crystals 6, the single-crystal pull-up apparatus 1 charges the material 411 (polysilicon, red phosphorus (and germanium)) for producing 80 kg of the dopant-added melt 41 into the quartz crucible 311 as shown in FIG. 21 to produce the next one of the single crystals 6.

It is preferable that the controller of the single-crystal pull-up apparatus 1 sets the furnace pressure in a range from 13.3 kPa (100 Torr) to 60 kPa (450 Torr) while the single crystal(s) 6 other than the lastly-produced single crystal(s) 6 is cooled before the lastly-produced single crystal 6 is taken out (i.e., during the cooling step). When the furnace pressure is less than 13.3 kPa, the red phosphorus (volatile dopant) is evaporated to raise the resistivity of the single crystal 6 to be subsequently produced. On the other hand, when the furnace pressure exceeds 60 kPa, the evaporant is likely to be adhered in the chamber 30, so that the single crystalization for producing the single crystal 6 is hampered.

Resistivity of a silicon wafer obtained from the single crystal 6 thus produced is in a range from 0.6 mΩ·cm to 0.9 mΩ·cm. Further, the oxygen concentration of the silicon wafer is in a range from $7 \times 10^{17}$ to $10 \times 10^{17}$ atoms/cm$^3$ (according to IGFA (Inert Gas Fusion Analysis)). The concentration of red phosphorus is in a range from $8.0 \times 10^{19}$ to $1.1 \times 10^{20}$ atoms/cm$^3$. The concentration of germanium is in a range from $3.0 \times 10^{19}$ to $3.0 \times 10^{20}$ atoms/cm$^3$.

Further, when the silicon wafer is heated for 30 seconds or more in a hydrogen atmosphere at 1200 degrees C., the LPD (of 90 nm or more) number on the surface of the silicon wafer measured by DCN mode of SP-1 manufactured by KLA-Tencor Corporation is 0.1/cm$^2$ or less. In other words, the number of pit(s) generated on the surface of the silicon wafer is 0.1/cm$^2$ or less.

Producing Method of Epitaxial Silicon Wafer

Next, a method for producing an epitaxial silicon wafer (not shown) from the single crystal 6 produced according to the producing method as described above will be described below.

Initially, after cutting off a silicon crystal plate from the single crystal 6 (first step), the silicon wafer is subjected to a prebaking treatment in order to anneal out oxygen from a surface layer of the silicon wafer (second step).

The prebaking treatment is preferably performed in a hydrogen atmosphere at a temperature in a range from 1,150 to 1,200 degrees C. for a prebaking period of 30 seconds or more (e.g. 30 seconds at the shortest).

After the prebaking treatment, an epitaxial film is formed on the silicon wafer through CVD (third step). The process temperature during the epitaxial growth is in a range from 1,000 to 1,150 degrees C., preferably in a range from 1,050 to 1,080 degrees C.

Through the above producing process, an epitaxial silicon wafer, that exhibits the extremely low resistivity of the silicon wafer in a range from 0.6 mΩ·cm to 0.9 mΩ·cm, has the extremely small number of misfit dislocation in the epitaxial film, and has the LPD number resulting from the SF (stacking fault) of $0.1/cm^2$ or less, which is sufficiently practicable as a power MOS transistor, can be produced.

Such a high-quality epitaxial silicon wafer that exhibits the extremely low resistivity of the silicon wafer and the extremely small number of LPD resulting from the SF (stacking fault) cannot be produced by a conventional producing method, but can only be produced according to the producing method of the invention and therefore is new.

Modifications

It should be understood that the scope of the invention is not limited to the above-described exemplary embodiment(s) but various improvements and design alterations are possible as long as such improvements and alterations are compatible with the invention.

For instance, instead of the multi-pull-up process as shown in FIG. 21, a so-called single-charge pull-up process may be employed in order to produce the single crystal 6, where a single-crystal pull-up apparatus 1 as shown in FIG. 22 is used. The dopant-added melt 41 for a plurality of single crystals are charged at one time in a shared quartz crucible 311, and a plurality of single crystals 6 are pulled up one by one.

When two single crystals 6 are to be produced, it is preferable that the controller of the single-crystal pull-up apparatus 1 sets the furnace pressure in a range from 13.3 kPa to 60 kPa while the first one of the single crystals 6 is cooled after being pulled up to be taken out (i.e., during the cooling step). The reason for the preferability of the adjustment of the furnace pressure is the same as that in the multi-pull-up process in the above exemplary embodiment.

It should be noted that, even when the multi-pull-up process is performed, the above single-charge pull-up process is applicable without adding material(s) at the time of pulling up the last single crystal.

For instance, 160 kg of the dopant-added melt 41 may be charged at an initial stage, and the single crystals 6 provided with the straight body 63 having the length of 550 mm and the tail 64 having the length of 140 mm may be pulled up for three consecutive times. Also in the above arrangement, the time during which the temperature at each position in the entire area of the straight body 63 falls within 570±70 degrees C. can be in a range from 20 minutes to 200 minutes.

The diameter of the single crystal may exceed 200 mm, or may be less than 200 mm.

When the temperature of the upper end 63A of the straight body 63 is 590 degrees C. or more in the withdrawal step, the total length of the straight body 63 and the tail 64 may be 690 mm or less. In this case, the yield is preferably 100%, however, even when the slip dislocation occurs at the lower end 63B of the straight body 63, the length of the straight body 63 may exceed 550 mm or may be less than 550 mm as long as the yield becomes 90% or more. Further, as long as the yield becomes 90% or more, the length of the tail 64 may be less than 140 mm or may exceed 140 mm. Furthermore, in the withdrawal step, the single crystal having the lower end 63B of the straight body 63 which is not provided with the tail 64 may be withdrawn from the dopant-added melt 41.

In the above exemplary embodiment, in the state that the distance between the upper end 63A of the straight body 63 and the surface of the dopant-added melt 41 is 730 mm or less, the withdrawal step may be performed. In this case, in a state that the temperature of the upper end 63A of the straight body 63 is less than 590 degrees C., the withdrawal step is performed, so that SF may be generated at the upper end 63A of the straight body 63, or slip dislocation may occur at the lower end 63B of the straight body 63. However, the epitaxial silicon wafer in which the yield is 90% or more and the LPD caused by the SF is restrained can be obtained without affecting the production efficiency significantly. It should be note that, the above-described condition is exemplified by a case in which the length of the straight body 63 is 550 mm and the length of the tail 64 is 180 mm as shown in FIG. 19. However, as long as the total length of the straight body 63 and the tail 64 is 730 mm or less at the same time as the yield is 90% or more, the length of the straight body 63 may exceed 550 mm and may be less than 550 mm, and the length of the tail 64 may be less than 180 mm and may exceed 180 mm. Further, in the withdrawal step, the single crystal having the lower end 63B of the straight body 63 which is not provided with the tail 64 may be withdrawn from the dopant-added melt 41.

The invention claimed is:

1. A method for producing a single crystal using a single-crystal pull-up apparatus comprising a chamber, a crucible disposed in the chamber and configured to receive a dopant-added melt in which red phosphorus is added to a silicon melt, and a pull-up section that is configured to pull up a seed crystal after bringing the seed crystal into contact with the dopant-added melt, the method comprising:
   bringing the seed crystal into contact with the dopant-added melt, in which the red phosphorus is added to the silicon melt, such that a resistivity of the single crystal is 0.9 mΩ·cm or less and subsequently pulling up the seed crystal, to form a straight body having a length of 550 mm or less and a diameter of 200 mm;
   forming a tail at a lower end of the straight body, the tail having a length in a range from 100 mm to 140 mm; and
   withdrawing the single crystal from the dopant-added melt in a state that a temperature of an upper end of the straight body is 590 degrees C. or more so as to adjust an area of the straight body to have a predetermined length, a residence time of the area at the temperature of 570±70 degrees C. ranging from 20 minutes to 200 minutes.

2. A method for producing a single crystal using a single-crystal pull-up apparatus comprising a chamber, a crucible disposed in the chamber and configured to receive a dopant-added melt in which red phosphorus is added to a silicon melt, and a pull-up section that is configured to pull up a seed crystal after bringing the seed crystal into contact with the dopant-added melt, the method comprising:
   bringing the seed crystal into contact with the dopant-added melt, in which the red phosphorus is added to the silicon melt, such that a resistivity of the single crystal is 0.9 mΩ·cm or less and subsequently pulling up the seed crystal, to form a straight body having a length of 550 mm or less and a diameter of 200 mm;

forming a tail at a lower end of the straight body, the tail having a length in a range from 100 mm to 180 mm; and withdrawing the single crystal from the dopant-added melt so as to adjust an area of the straight body to have a predetermined length, a residence time of the area at the temperature of 570±70 degrees C. ranging from 20 minutes to 200 minutes.

3. The method for producing a single crystal according to claim 1, wherein the single crystal is produced plural times to produce a plurality of the single crystals, the dopant-added melt in an amount capable of producing one of the plurality of single crystals is received in the crucible, and each time one of the plurality of single crystals is produced, a silicon polycrystal material and the red phosphorus are added to the crucible to produce a next one of the plurality of single crystals.

4. The method for producing a single crystal according to claim 1, wherein the dopant-added melt in an amount capable of producing a plurality of single crystals is received in the crucible, and the plurality of single crystals are produced one by one without adding a silicon polycrystal material and the red phosphorus to the crucible.

5. A method for producing a silicon wafer, comprising cutting off a silicon wafer from a straight body of a single crystal produced by the producing method of a single crystal according to claim 1.

6. A method for producing an epitaxial silicon wafer comprising:

heating a silicon wafer produced by the producing method of a silicon wafer according to claim 5 in a hydrogen atmosphere in a first step; and forming an epitaxial film on the silicon wafer after the first step to produce an epitaxial silicon wafer in a second step.

7. The method for producing a single crystal according to claim 2, wherein the single crystal is produced plural times to produce a plurality of the single crystals, the dopant-added melt in an amount capable of producing one of the plurality of single crystals is received in the crucible, and each time one of the plurality of single crystals is produced, a silicon polycrystal material and the red phosphorus are added to the crucible to produce a next one of the plurality of single crystals.

8. The method for producing a single crystal according to claim 2, wherein the dopant-added melt in an amount capable of producing a plurality of single crystals is received in the crucible, and the plurality of single crystals are produced one by one without adding a silicon polycrystal material and the red phosphorus to the crucible.

9. A method for producing a silicon wafer, comprising cutting off a silicon wafer from a straight body of a single crystal produced by the producing method of a single crystal according to claim 2.

10. A method for producing an epitaxial silicon wafer comprising:

heating a silicon wafer produced by the producing method of a silicon wafer according to claim 9 in a hydrogen atmosphere in a first step; and forming an epitaxial film on the silicon wafer after the first step to produce an epitaxial silicon wafer in a second step.

11. The method for producing a single crystal according to claim 1, wherein in the withdrawing of the single crystal, the single crystal is withdrawn from the dopant-added melt such that a yield in the straight body is 90% or more.

12. The method for producing a single crystal according to claim 2, wherein in the withdrawing of the single crystal, the single crystal is withdrawn from the dopant-added melt such that a yield in the straight body is 90% or more.

* * * * *